United States Patent
Chung et al.

(10) Patent No.: US 11,442,811 B1
(45) Date of Patent: Sep. 13, 2022

(54) APPARATUS AND METHOD FOR USING AN ERROR CORRECTION CODE IN A MEMORY SYSTEM

(71) Applicant: SK hynix Inc., Icheon-si (KR)

(72) Inventors: Bi Woong Chung, Icheon-si (KR); Jung Hwan Lee, Icheon-si (KR); Se Yeong Huh, Icheon-si (KR); In Jae Koo, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 17/378,176

(22) Filed: Jul. 16, 2021

(30) Foreign Application Priority Data

Feb. 24, 2021 (KR) ........................ 10-2021-0024565

(51) Int. Cl.
*G06F 11/10* (2006.01)
*H03M 13/00* (2006.01)

(52) U.S. Cl.
CPC ....... *G06F 11/1076* (2013.01); *H03M 13/616* (2013.01)

(58) Field of Classification Search
CPC .................... G06F 11/1076; H03M 13/616
See application file for complete search history.

(56) References Cited

U.S. PATENT DOCUMENTS

| | | | |
|---|---|---|---|
| 7,499,490 B2 | 3/2009 | Divsalar et al. | |
| 8,359,515 B2 | 1/2013 | Gunnam | |
| 8,433,982 B2 * | 4/2013 | Li ....................... | H03M 13/235 |
| | | | 714/790 |
| 10,298,261 B2 | 5/2019 | Nemati Anaraki et al. | |
| 10,389,383 B2 * | 8/2019 | Xiong ................. | H03M 13/118 |
| 10,503,583 B2 | 12/2019 | Murakami | |
| 11,138,069 B2 * | 10/2021 | Perlmutter .......... | G06F 11/1068 |
| 2020/0036477 A1 * | 1/2020 | Xu ........................ | H03M 13/09 |

FOREIGN PATENT DOCUMENTS

KR   101730277 B1   4/2017

* cited by examiner

*Primary Examiner* — Phung M Chung
(74) *Attorney, Agent, or Firm* — Perkins Coie LLP

(57) ABSTRACT

Error correction code apparatuses and memory systems are disclosed. The apparatus may include an encoder configured to generate a first result by multiplying bits of the data by a first matrix, divides parity bits into a first parity group obtained by multiplying the first result by a second matrix and a second parity group obtained by an exclusive OR operation of the first result and the first parity group, based on a plurality of polynomials determined based on the second matrix, and multiply the first result and the second matrix to generate one or more first parity bits in the first parity group, perform an exclusive OR operation on the first result and the first parity group to generate one or more second parity bits in the second parity group, and generate a codeword having the bits of the data bits and the parity bits.

20 Claims, 9 Drawing Sheets

FIG. 9

$$u \cdot H_1^t + p \cdot H_2^t = 0$$

$$\underbrace{[x_0 \ x_1 \cdots x_{M-1}]}_{632} + \underbrace{[p_0 \ p_1 \cdots p_{M-1}]}_{634, 636} \cdot \underbrace{\begin{bmatrix} h_{0,0} & h_{0,1} & \cdots & h_{0,M-1} \\ h_{1,0} & h_{1,1} & \cdots & h_{1,M-1} \\ \vdots & \vdots & \ddots & \vdots \\ h_{M-1,0} & h_{M-1,1} & \cdots & h_{M-1,M-1} \end{bmatrix}}_{\text{Sparse Matrix}} = [0 \ 0 \cdots 0]$$

$$H_2 = \begin{bmatrix} 0&0&1&1&0&0&1&0&0&0 \\ 1&0&0&1&0&0&0&1&0&0 \\ 1&0&0&0&0&0&1&0&1&0 \\ 0&0&0&1&1&0&0&1&0&0 \\ 0&0&1&0&0&1&0&1&0&0 \\ 0&1&0&0&1&0&0&0&0&1 \\ 0&0&1&0&0&0&1&0&0&1 \\ 1&0&0&0&0&1&0&0&1&0 \\ 0&1&0&0&1&0&0&0&1&0 \\ 0&1&0&0&0&1&0&0&0&1 \end{bmatrix}$$

Calculation Sequence:

$x0 + p2 + p3 + p6 = 0$ ⇒ G multiplication for p2, p3; XOR for p6
$x1 + p0 + p3 + p7 = 0$ ⇒ G multiplication for p0; XOR for p7
$x2 + p0 + p6 + p8 = 0$ ⇒ XOR for p8
$x3 + p3 + p4 + p7 = 0$ ⇒ XOR for p4
$x4 + p2 + p5 + p7 = 0$ ⇒ XOR for p5
$x6 + p2 + p6 + p9 = 0$ ⇒ XOR for p9
$x5 + p1 + p4 + p9 = 0$ ⇒ XOR for p1
$x7 + p0 + p5 + p8 = 0$ ⇒
$x8 + p1 + p4 + p8 = 0$ ⇒
$x9 + p1 + p5 + p9 = 0$ ⇒

FIG. 11

| Type | | Code | Gate Count |
|---|---|---|---|
| 2KB | Conventional Case | 2KB TLC | $\alpha$ |
| 4KB | Conventional Case | 4KB TLC, QLC | $1.33 \sim 1.39\alpha$ |
| 4KB | Embodiment | 4KB TLC, QLC | $0.85 \sim 0.92\alpha$ |

APPARATUS AND METHOD FOR USING AN ERROR CORRECTION CODE IN A MEMORY SYSTEM

CROSS-REFERENCE TO RELATED APPLICATIONS

This patent application claims the priority and benefits of Korean Patent Application No. 10-2021-0024565, filed on Feb. 24, 2021, the entire disclosure of which is incorporated herein by reference.

TECHNICAL FIELD

The embodiments of the disclosed technology relate to apparatus and methods for using an error correction code in a memory system.

BACKGROUND

Recently, the computing environment paradigm is transitioning to ubiquitous computing, enabling computing to appear anytime and anywhere. The recent increase in the use of ubiquitous computing is leading to an increase in the use of portable electronic devices (e.g., mobile phones, digital cameras, notebook computers, or others). Such portable electronic devices may use or include a memory system having at least one memory device as its data storage medium. The memory system may be a data storage device, which can be used as a main storage device or an auxiliary storage device of a portable electronic device.

Such a semiconductor-based data storage device provides advantages over the traditional hard disk drives since semiconductor memory devices have no mechanical moving parts (e.g., a mechanical arm), and thus offers excellent stability and durability, high data rate and low power consumption. Examples of the semiconductor-based data storage device include, but are not limited to, Universal Serial Bus (USB) memory devices, memory cards having various interfaces, and solid state drives (SSDs).

SUMMARY

The embodiments of the disclosed technology relate error correction code encoding and decoding schemes that can reduce the complexity of encoder and decoder designs.

In some embodiments of the disclosed technology, an error correction code apparatus includes a data input node configured to receive data to be encoded, and an encoder in communication with the data input node and configured to: generate a first result by multiplying bits of the data by a first matrix; divide parity bits into a first parity group obtained by multiplying the first result by a second matrix and a second parity group obtained by an exclusive OR operation on the first result and the first parity group, based on a plurality of polynomials determined based on the second matrix; multiply the first result and the second matrix to generate one or more first parity bits in the first parity group; perform an exclusive OR operation on the first result and the first parity group to generate one or more second parity bits in the second parity group; and generate a codeword having the bits of the data bits and the parity bits.

In some embodiments of the disclosed technology, a memory system includes a memory device comprising a plurality of non-volatile memory cells, and a controller in communication with the memory device and configured to store a codeword in the plurality of non-volatile memory cells or read the codeword from the plurality of non-volatile memory cells, wherein the controller is configured to: multiply one or more data bits by a first matrix to generate a first result; divide parity bits into a first parity group obtained by multiplying the first result by a second matrix and a second parity group obtained by an exclusive OR operation on the first result and the first parity group, based on a plurality of polynomials determined based on the second matrix; perform a computation for obtaining the first parity group and the second parity group; and combine the one or more data bits and the first and second parity bits to generate the codeword.

In some embodiments of the disclosed technology, a method for operating a memory system includes checking one or more data bits and a program command input from an external device, multiplying the one or more data bits by a first matrix to generate a first result, dividing parity bits into a first parity group obtained by multiplying the first result by a second matrix and a second parity group obtained by an exclusive OR operation on the first result and the first parity group, based on a plurality of polynomials determined based on the second matrix, performing a computation for obtaining the first parity group and the second parity group, and combining the one or more data bits and the first and second parity bits to generate a codeword to be written to the memory system.

In some embodiments of the disclosed technology, an error correction code apparatus includes a data input node configured to receive data to be encoded; and an encoder in communication with the data input node and configured to (a) generate a first result by multiplying a first number of data bits by a first matrix, (b) generate a first parity group that includes one or more first parity bits and obtained by multiplying the first result by a second matrix, (c) generate a second parity group that includes one or more second parity bits by performing an exclusive OR operation on the first result and the first parity group, (d) determine a number of parity bits for producing an LDPC-encoded codeword based on the first parity group and the second parity group; and (e) generate a codeword having the first number of data bits and the number of parity bits determined in operation (d).

In some embodiments of the disclosed technology, a memory system includes a memory device comprising a plurality of non-volatile memory cells, and a controller in communication with the memory device and configured to store a codeword in the plurality of non-volatile memory cells or read the codeword from the plurality of non-volatile memory cells, wherein the controller is configured to: (a) multiply one or more data bits by a first matrix to generate a first result, (b) generate a first parity group that includes one or more first parity bits by multiplying the first result by a second matrix, (c) generate a second parity group that includes one or more second parity bits by performing an exclusive OR operation on the first result and the first parity group based on one or more computations including a multiplication of the first result and the second matrix, (d) perform a computation for obtaining the first parity group and the second parity group, and (e) combine the one or more data bits and the first and second parity bits to generate the codeword.

In some embodiments of the disclosed technology, a method for operating a memory system includes checking one or more data bits and a program command provided by an external device, multiplying the one or more data bits by a first matrix to generate a first result, generating a first parity group that includes one or more first parity bits by multiplying the first result by a second matrix and generating a second parity group that includes one or more second parity bits by performing an exclusive OR operation on the first result and the first parity group based on one or more computations including a multiplication of the first result and the second matrix, performing a computation for obtaining the first parity group and the second parity group, and combining the one or more data bits and the first and second parity bits to generate a codeword to be written to the memory system.

In some embodiments of the disclosed technology, an error correction code apparatus includes an encoder configured to generate M-bit parity corresponding to K-bit data to output a codeword having a N-bit size (N=K+M), wherein the encoder multiplies the K-bit data by a first matrix to generate a first result, divides the M-bit parity into a first parity group, obtained by multiplying the first result by a second matrix, and a second parity group, obtained by an exclusive OR operation of the first result and the first parity group, based on a plurality of polynomials generated multiplying the first result by the second matrix, and performs computation for obtaining the first parity group and the second parity group, and a decoder configured to detect and correct an error in the codeword generated by the encoder.

In some embodiments of the disclosed technology, a memory system includes a memory device comprising a plurality of non-volatile memory cells, and a controller configured to store a codeword in the plurality of non-volatile memory cells or read the codeword from the plurality of non-volatile memory cells, wherein the controller is configured to multiplies data by a first matrix to generate a first result, divides the parity into a first parity group, obtained by multiplying the first result by a second matrix, and a second parity group, obtained by an exclusive OR operation of the first result and the first parity group, based on a plurality of polynomials generated multiplying the first result by the second matrix, performs computation for obtaining the first parity group and the second parity group and combines the data and the parity to generate the codeword to the memory device.

In some embodiments of the disclosed technology, a method for operating a memory system includes checking data and a program command input from an external device, multiplying the data by a first matrix to generate a first result, dividing the parity into a first parity group, obtained by multiplying the first result by a second matrix, and a second parity group, obtained by an exclusive OR operation of the first result and the first parity group, based on a plurality of polynomials generated multiplying the first result by the second matrix, performing computation for obtaining the first parity group and the second parity group, and combining the data and the parity to generate the codeword to program the codeword in the memory device.

BRIEF DESCRIPTION OF THE DRAWINGS

FIG. 9 illustrates calculations of a low density parity check (LDPC) code based on some embodiments of the disclosed technology.

FIG. 10 illustrates matrix multiplications and logic operations that are performed to obtain the LDPC code described in FIG. 9.

FIG. 11 illustrates an effect of an encoding apparatus in a memory system based on some embodiments of the disclosed technology.

DETAILED DESCRIPTION

Figure 1:
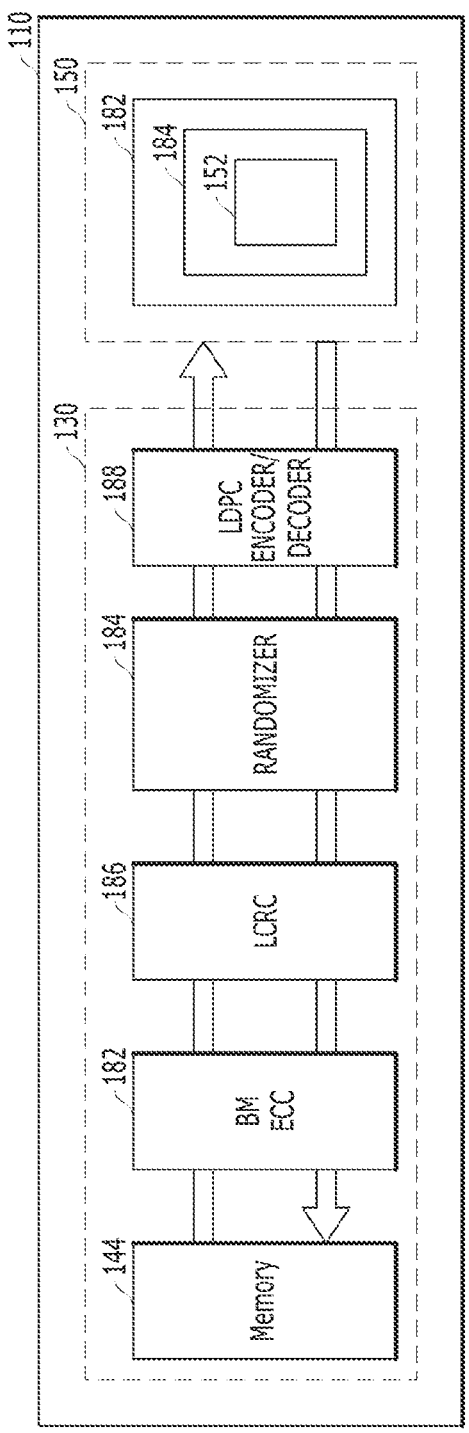
FIG. 1 illustrates an example of a memory system based on some embodiments of the disclosed technology.

Various embodiments of the disclosure are described below with reference to the accompanying drawings. Elements and features of the disclosure, however, may be configured or arranged differently to form other embodiments, which may be variations of any of the disclosed embodiments.

In this disclosure, references to various features (e.g., elements, structures, modules, components, steps, operations, characteristics, etc.) included in "one embodiment," "example embodiment," "an embodiment," "another embodiment," "some embodiments," "various embodiments," "other embodiments," "alternative embodiment," and the like are intended to mean that any such features are included in one or more embodiments of the present disclosure, but may or may not necessarily be combined in the same embodiments.

In this disclosure, the terms "comprise," "comprising," "include," and "including" are open-ended. As used in the appended claims, these terms specify the presence of the stated elements and do not preclude the presence or addition of one or more other elements. The terms in a claim does not foreclose the apparatus from including additional components (e.g., an interface unit, circuitry, etc.).

In this disclosure, various units, circuits, or other components may be described or claimed as "configured to" perform a task or tasks. In such contexts, "configured to" is used to connote structure by indicating that the blocks/units/circuits/components include structure (e.g., circuitry) that performs one or more tasks during operation. As such, the block/unit/circuit/component can be said to be configured to perform the task even when the specified block/unit/circuit/component is not currently operational (e.g., is not turned on nor activated). The block/unit/circuit/component used with the "configured to" language include hardware-for example, circuits, memory storing program instructions executable to implement the operation, etc. Additionally, "configured to" can include generic structure (e.g., generic circuitry) that is manipulated by software and/or firmware (e.g., an FPGA or a general-purpose processor executing software) to operate in manner that is capable of performing the task(s) at issue. "Configured to" may also include adapting a manufacturing process (e.g., a semiconductor fabrication facility) to fabricate devices (e.g., integrated circuits) that are adapted to implement or perform one or more tasks.

As used in the disclosure, the term 'circuitry' or 'logic' refers to all of the following: (a) hardware-only circuit implementations (such as implementations in only analog and/or digital circuitry) and (b) combinations of circuits and software (and/or firmware), such as (as applicable): (i) to a combination of processor(s) or (ii) to portions of processor(s)/software (including digital signal processor(s)), software, and memory(ies) that work together to cause an apparatus, such as a mobile phone or server, to perform various functions) and (c) circuits, such as a microprocessor(s) or a portion of a microprocessor(s), that require software or firmware for operation, even if the software or firmware is not physically present. This definition of 'circuitry' or 'logic' applies to all uses of this term in this application, including in any claims. As a further example, as used in this application, the term "circuitry" or "logic" also covers an implementation of merely a processor (or multiple processors) or portion of a processor and its (or their) accompanying software and/or firmware. The term "circuitry" or "logic" also covers, for example, and if applicable to a particular claim element, an integrated circuit for a storage device.

As used herein, these terms "first," "second," "third," and so on are used as labels for nouns that they precede, and do not imply any type of ordering (e.g., spatial, temporal, logical, etc.). The terms "first" and "second" do not necessarily imply that the first value must be written before the second value. Further, although the terms may be used herein to identify various elements, these elements are not limited by these terms. These terms are used to distinguish one element from another element that otherwise have the same or similar names. For example, a first circuitry may be distinguished from a second circuitry.

Further, the term "based on" is used to describe one or more factors that affect a determination. This term does not foreclose additional factors that may affect a determination. That is, a determination may be solely based on those factors or based, at least in part, on those factors. Consider the phrase "determine A based on B." While in this case, B is a factor that affects the determination of A, such a phrase does not foreclose the determination of A from also being based on C. In other instances, A may be determined based solely on B.

Herein, an item of data, a data item, a data entry or an entry of data may be a sequence of bits. For example, the data item may include the contents of a file, a portion of the file, a page in memory, an object in an object-oriented program, a digital message, a digital scanned image, a part of a video or audio signal, metadata or any other entity which can be represented by a sequence of bits. According to an embodiment, the data item may include a discrete object. According to another embodiment, the data item may include a unit of information within a transmission packet between two different components.

The disclosed technology can be implemented in some embodiments to provide a data processing system and a method for operating the data processing system. In some implementations, the data processing system includes components and resources that are configured to store data and may dynamically allocate data paths to be used for data communication between the components and resources based on their usages.

In addition, the disclosed technology can be implemented in some embodiments to provide an apparatus and a method for improving performance of the memory system by reducing the amount of computation that are performed based on a low density parity check (LDPC) code, which is an error correction code for detecting and correcting errors in data that is read out from a memory system or non-volatile memory cells.

In some implementations of the disclosed technology, the memory system may generate parity bits to perform an encoding based on the LDPC code by dividing the parity bits into two groups: (1) a first group obtained by multiplying a first matrix by a second matrix; and (2) a second group obtained by a simple logic operation (e.g., an exclusive OR (XOR) operation). The memory system can change the calculation sequence to reduce the number of matrix multiplications, thereby reducing the amount of calculation needed to generate the parity bits.

The disclosed technology may also be implemented based on some embodiments to reduce the amount of computation needed to perform an encoding based on a regular or irregular LDPC code corresponding to a data size in a read operation or write operation performed within a memory system, thereby reducing the complexity of encoder and decoder designs and resource consumption in the memory system.

In some implementations, an encoder may: generate a first result by multiplying a first number of data bits by a first matrix; divide a second number of parity bits into a first parity group obtained by multiplying the first result by a second matrix and a second parity group obtained by an exclusive OR operation on the first result and the first parity group, based on a plurality of polynomials determined based on the second matrix; generate one or more first parity bits included in the first parity group obtained by multiplying the first result by a second matrix; generate one or more second parity bits in the second parity group obtained by performing an exclusive OR operation on the first result and the first parity group; and generate a codeword having the first number of data bits and the second number of parity bits.

In an embodiment, an error correction code apparatus can include a data input node configured to receive data to be encoded; and an encoder in communication with the data input node and configured to: generate a first result by multiplying bits of the data by a first matrix; divide parity bits into a first parity group obtained by multiplying the first result by a second matrix and a second parity group obtained by an exclusive OR operation on the first result and the first parity group, based on a plurality of polynomials determined based on the second matrix; multiply the first result and the second matrix to generate one or more first parity bits in the first parity group; perform an exclusive OR operation on the first result and the first parity group to generate one or more second parity bits in the second parity group; and generate a codeword having the bits of the data bits and the parity bits.

The encoder can be configured to change a calculation sequence for generating the one or more first parity bits and the one more second parity bits to reduce a number of first parity bits included in the first parity group.

The encoder can be configured to use one or more first or second parity bits that have been calculated in the first parity group or the second parity group to perform a subsequent exclusive OR operation, based on a calculation sequence, for generating another second parity bit.

The encoder can include a first calculator configured to multiply the bits of the data by the first matrix to output the first result; a first selector configured to divide the parity bits into the first parity group and the second parity group; a second calculator configured to multiply the first result by the second matrix to determine the one or more first parity bits included in the first parity group; a second selector configured to selectively transfer an output of the second calculator for the exclusive OR operation; determination circuitry configured to sequentially group the number of parity bits and feedback at least one parity bit for the exclusive OR operation; and a third calculator configured to perform the exclusive OR operation on the first result and the first and second parity bits outputted from the second selector and the determination circuitry to obtain the one or more second parity bits included in the second parity group.

The first matrix can include: a number of rows that represents the number of the bits of data; and a number of columns that represents the number of parity bits, and the second matrix includes: a number of rows that represents the first number of parity bits; and a number of columns that represents the first number of parity bits.

Each of the plurality of polynomials determined by multiplication of the first result and the second matrix can include a mathematical relationship between the first result and at least part of the parity bits.

In another embodiment, a memory system can include a memory device comprising a plurality of non-volatile memory cells; and a controller in communication with the memory device and configured to store a codeword in the plurality of non-volatile memory cells or read the codeword from the plurality of non-volatile memory cells. The controller is configured to: multiply one or more data bits by a first matrix to generate a first result; divide parity bits into a first parity group obtained by multiplying the first result by a second matrix and a second parity group obtained by an exclusive OR operation on the first result and the first parity group, based on a plurality of polynomials determined based on the second matrix; perform a computation for obtaining the first parity group and the second parity group; and combine the one or more data bits and the first and second parity bits to generate the codeword.

A length of the codeword can be determined based on a length of the one or more bits programmed or read at each program operation or read operation.

The controller can be configured to change a calculation sequence for generating the one or more first parity bits in the first parity group and the one more second parity bits in the second parity group to reduce a number of first parity bits included in the first parity group.

The controller can be configured to use one or more first or second parity bits that have been calculated in the first parity group or the second parity group to perform a subsequent exclusive OR operation, based on a calculation sequence, for generating another second parity bit.

The controller can include a first calculator configured to multiply the one or more data bits by the first matrix to output the first result; a first selector configured to divide the parity bits into the first parity group and the second parity group; a second calculator configured to multiply the first result by the second matrix to determine the one or more first parity bits included in the first parity group; a second selector configured to selectively transfer an output of the second calculator for the exclusive OR operation; determination circuitry configured to sequentially group the first and second parity bits included in the first and second parity groups and feedback at least one parity bit for the exclusive OR operation; and a third calculator configured to perform the exclusive OR operation on the first result and the first and second parity bits outputted from the second selector and the determination circuitry to obtain the one or more second parity bits included in the second parity group.

The one or more data bits can include a first number of data bits and the parity bits include a second number of parity bits, and wherein the first matrix includes: a number of columns that represents the number of parity bits; and a number of rows that represents the first number of data bits, and the second matrix includes: a number of rows that represents the second number of parity bits; and a number of columns that represents the second number of parity bits.

Each of the plurality of polynomials determined by multiplication of the first result and the second matrix can include a mathematical relationship between the first result and at least part of the parity bits.

The controller can be configured to detect and correct an error in the codeword upon receipt of the codeword from the memory device.

In another embodiment, a method for operating a memory system can include checking one or more data bits and a program command input from an external device; multiplying the one or more data bits by a first matrix to generate a first result; dividing parity bits into a first parity group obtained by multiplying the first result by a second matrix and a second parity group obtained by an exclusive OR operation on the first result and the first parity group, based on a plurality of polynomials determined based on the second matrix; performing a computation for obtaining the first parity group and the second parity group; and combining the one or more data bits and the first and second parity bits to generate a codeword to be written to the memory system.

A length of the codeword can be determined based on a length of the one or more bits programmed or read once at each program operation or read operation.

The method can further include changing a calculation sequence for generating the one or more first parity bits in the first parity group and the one more second parity bits in the second parity group to reduce a number of first parity bits included in the first parity group.

The one or more first or second parity bits that have been calculated in the first parity group or the second parity group can be used to perform a subsequent exclusive OR operation for generating another second parity bit according to a calculation sequence of the plurality of polynomials.

The one or more data bits can include a first number of data bits and the parity bits include a second number of parity bits. The first matrix can include: a number of columns that represents the number of parity bits; and a number of rows that represents the first number of data bits, and the second matrix includes: a number of rows that represents the second number of parity bits; and a number of columns that represents the second number of parity bits.

The plurality of polynomials determined by multiplication of the first result and the second matrix can include a mathematical relationship between the first result and at least part of the parity bits.

FIG. 1 illustrates an example of a memory system 110 based on some embodiments of the disclosed technology.

Referring to FIG. 1, the memory system 110 may include a memory device 150 and a controller 130. The memory device 150 and the controller 130 may be physically separated from each other in the memory system 110. The memory device 150 and the controller 130 may be connected via at least one data path. For example, the data path may include a channel and/or a way. In some embodiments of the disclosed technology, the memory device 150 and the controller 130 may be functionally divided. Further, in some embodiments of the disclosed technology, the memory device 150 and the controller 130 may be implemented with a single chip or a plurality of chips.

The memory device 150 may include a plurality of memory blocks 152. The memory block 152 may include a group of non-volatile memory cells in which data is erased together during a single erase operation. The memory block 152 may include a plurality of pages. In some embodiments of the disclosed technology, each page may include a group of non-volatile memory cells in which data is stored together during a single program operation or read out together during a single read operation.

The memory device 150 may include a plurality of memory planes 184 or a plurality of memory chip dies 182. In some embodiments of the disclosed technology, a memory plane 184 may include a logical or a physical partition including at least one memory block 152, a driving circuit capable of controlling an array including a plurality of non-volatile memory cells, and a buffer that can temporarily store data to be input to the non-volatile memory cells or data output from non-volatile memory cells.

In addition, in some embodiments of the disclosed technology, a memory chip die 182 may include at least one memory plane 184. The memory chip die 182 may include a set of components implemented on a substrate. Each memory chip die 182 may be connected to the controller 130 through a data path. Each memory chip die 182 may include an interface to exchange data and a signal with the controller 130.

In some embodiments of the disclosed technology, the memory device 150 may include at least one memory block 152, at least one memory plane 184, or at least one memory chip die 182. The internal configuration of the memory device 150 shown in FIG. 1 may be modified to meet performance requirements of the memory system 110.

The controller 130 may perform a data input/output operation in response to a request from the external device. For example, when the controller 130 performs a read operation in response to a read request from the external device, data stored in a plurality of non-volatile memory cells included in the memory device 150 is transferred to the controller 130.

The controller 130 may use a memory 144 for the data input/output operation. For example, the controller 130 may temporarily store the data transferred from the memory device 150 in a memory 144 shown in FIGS. 2 and 3. The controller 130 may output the data stored in the memory 144 to the external device in response to the read request.

As manufacturers decrease the physical size of the memory system 110 while increasing its data storage capacity within a limited memory bandwidth for its data input/output operation, the error rates in the data read out from the memory system 110 can increase. In order to enhance the performance of the memory system 110, the data requested by the external device should be stored in the memory device 150 and read out to the external device without an error. The error in the read-out data may occur inside the memory device 150 or during the data communication between the controller 130 and the memory device 150. To improve performance of the memory system 110, the error in the read-out data is corrected using error correction codes. In some implementations, the controller 130 can encode data provided by an external device based on an error correction code and write (program) encoded data in the memory device 150. During a read operation, the controller can 130 can detect errors in the encoded data read from the memory device 150 and correct the errors by decoding the encoded data based on the error correction code.

In one example, the errors in the data read out from the memory device 150 may occur as discussed below. Each of the plurality of non-volatile memory cells in the memory device 150 may include the smallest physical component for storing data. A non-volatile memory cell can be classified into a single-level cell (SLC), which is configured to store 1-bit data per cell, a multi-level cells (MLC), which is configured to store 2-bit data per cell, a triple-level cell (TLC), which is configured to store 3-bit data per cell depending on how many bits of data can be stored in a single memory cell. In some implementations, non-volatile memory cells are located at each cross point of a bit line (BL) through which current flows to indicate the data stored in the memory cell. In other implementations, non-volatile memory cells are connected in series to a bit line (BL). Word lines (WL) are also arranged across a memory cell array of the non-volatile memory cells to select/activate certain memory cells. In some implementations, each of the non-volatile memory cells may include a floating gate FG to store electric charges corresponding to data bits. In one example, the floating gate FG may include a conductor material. In another example, the floating gate FG may include an insulator material such as an oxide film. When a high-level voltage (e.g., a positive high voltage) is applied from a control gate, electrons pass through an oxide layer disposed on the floating gate FG and enter the floating gate FG. The data can be written (programmed) to the non-volatile memory cell by allowing the electrons to pass through the oxide layer and remain in the floating gate FG. Conversely, to erase the programmed data from the non-volatile memory cell, the electrons trapped in the floating gate FG are removed from the floating gate FG by applying a high voltage (e.g., a positive high-level voltage) to a semiconductor substrate. As electrons move in and out of the non-volatile memory cell during a program operation and an erase operation, the oxide layer may be damaged, causing errors in read-out data. As the number of data bits that can be stored in the non-volatile memory cell increases (e.g., MLC, TLC, etc.), the data integrity of the non-volatile memory cell may decrease.

The controller 130 can include error correction circuitry configured to encode data using error correction codes to detect and correct errors in data read out from the memory device 150. In addition, controller 130 can include bad block control circuitry 182 to determine whether to discard or continue to use the non-volatile memory cells in which errors occurred. When a memory block is labeled as a bad block, the controller 130 does not write data to the "bad" memory block.

Further, the controller 130 can include a randomizer 184. When a data to be programmed in the memory device 150 has a regular pattern that includes a repetition of specific data, the reliability of the read-out data may be degraded due to an interference, e.g., Back Pattern Dependency (BPD), or a coupling between adjacent non-volatile memory cells. The Back Pattern Dependency (BPD) can occur when a threshold voltage of a non-volatile memory cell programmed first is increased by increased resistance of string when adjacent non-volatile memory cells are programmed during a random program operation or a min-max program operation. For example, when a program or read operation is performed in the memory device 150, the BPD may change a threshold voltage of a specific non-volatile memory cell according to a status pattern of adjacent non-volatile memory cells coupled via the same word line or bit line to the specific non-volatile memory cell.

In addition, the coupling occurs when a threshold voltage of a specific non-volatile memory cell increases in proportion to the change of threshold voltages of surrounding non-volatile memory cells adjacent to the specific memory cell. The randomizer 184 can be used to avoid distortion of voltage values corresponding to data that may occur due to the interference or the coupling between different memory cells. When statuses (e.g., programmed, erased, etc.) of the non-volatile memory cells in which a data is stored in the memory device 150 are equalized through the randomizer 184, it is possible to avoid distortion of a threshold voltage of non-volatile memory cell based on a specific pattern of the data, thereby improving the reliability of the data. The randomizer 184 might not eliminate all bad patterns that may occur in the memory device 150. However, the randomizer 184 can remove a typical bad pattern that is likely to occur in the data. For example, if all the memory cells in a specific page are programmed with zero (logic low) and all the memory cells in an immediately adjacent page are programmed with one (logic high), that data pattern can be characterized as a bad pattern. In some implementations, the randomizer 184 can randomize the data to reduce a gap between a good pattern and a bad pattern. Accordingly, the randomizer 184 may be used to randomize the data to be written to the memory device 150.

In some embodiments of the disclosed technology, the controller 130 may include circuitry configured to perform additional operations to enhance performance of the error correction and bad block control circuitry 182 and improve operational reliability. As a manufacturing process is refined, a size of a non-volatile memory cell can decrease. When the size of the non-volatile memory cell is smaller, the number of electrons stored (or trapped) in the non-volatile memory cell decreases, so that error probability can increase. Increasing data density or information density can decrease a noise margin and make the non-volatile memory cell vulnerable to an error. As a countermeasure to compensate for this issue, a more powerful error correction code (ECC) function could be used as the number of data bits per a non-volatile memory cell increases. In addition, the controller 130 may include additional circuitry for detecting and correcting errors that may occur in data communication between the controller 130 and the memory device 150 when the memory system 110 performs a data input/output operation at a high speed.

In the data communication between the controller 130 and the memory device 150, data may be transmitted and received according to a preset communication protocol. The data may be packaged in a data packet based on the corresponding protocol. For example, the controller 130 may support at least one protocol such as Fiber Channel (FC), Universal Serial Bus (USB) 3.0, Serial Attached SCSI (SAS), and Peripheral Component Interface Express (PCIe). The controller 130 may include Link Cyclic Redundancy Code (LCRC) circuitry 186 for detecting an error that may occur in the data communication between the memory device 150 and the controller 130. Herein, the Link Cyclic Redundancy Code (LCRC) is a sort of standard PCIe feature that protects the contents of a Transaction Layer Packet (TLP) across a single PCIe link.

In some implementations, the controller 130 and the memory device 150 support Peripheral Component Interconnect (PCI) Express (PCIe). PCIe can support a split transaction in which a request and a response are separated in a time domain, allowing the link to deliver a different traffic while a target device is collecting data included in the response. The controller 130 and the memory device 150 supporting PCIe can have a point-to-point connection and can be implemented in a dual-simplex method using two differential amplifiers in one direction. In addition, when the number of data transmission lines (or channels) in the bidirectional direction is increased, a bandwidth of data communication between the controller 130 and the memory device 150 may be configured to be scalable.

The data packet may be generated by the transaction layer and the data link layer. Depending on which layer is associated with, the data packet may be referred to as a transaction layer packet (TLP) or a data link layer packet (DLLP). In addition, a physical layer packet (PLP) may be generated for a link control by a physical layer. Further, packets of each layer can be exchanged between the same layer of parties connected by the link. For example, information is added before and after the data packet by lower protocol layers, and the data packet can be transmitted through the data transmission line. A packet received by the memory device 150 may be transmitted to an upper protocol layer after deleting the information added by each protocol layer. Specifically, the transaction layer packet (TLP) for end-to-end communication can include a TLP header, a data payload, and an End-to-end CRC (ECRC) (or Cyclic Redundancy Check) which are generated in the transaction layer. When transmitted in the data link layer, a sequence number and a link cyclic redundancy check (LCRC) may be added to the data link layer packet (DLLP). When received by the memory device 150, the sequence number and the link cyclic redundancy check (LCRC) can be deleted after inspection. The data link layer packet DLLP can be used for exchanging information such as an acknowledgment response (ACK) and a negative acknowledgment response (NAK) of the transaction layer packet (TLP) between both sides of the link.

In an embodiment of the disclosed technology, an apparatus and a method can be provided to reduce the amount of computation associated with the error correction circuitry 188 using the low-density parity check (LDPC) code. The parity check matrix H Matrix may include a plurality of matrices. The error correction circuitry 188 can multiply an input data by a first matrix to generate a first result obtained by multiplying data by a first matrix, divide a parity into a first parity group, obtained by multiplying the first result by a second matrix, and a second parity group, obtained by an exclusive OR operation of the first result and the first parity group, based on a plurality of polynomials generated by multiplying the first result by the second matrix. The error correction circuitry 188 can perform a matrix multiplication for obtaining the first parity group but perform a logical operation (e.g., an exclusive OR operation) to obtain the second parity group. After performing the computation to obtain the first and second parity groups, the error correction circuitry 188 can combine the parity, including the first and second parity groups, with the data to generate a codeword. The error correction circuitry 188 can transmit the codeword to the memory device 150.

In some embodiments of the disclosed technology, the controller 130 can include error correction circuitry 188 using a low density parity check (LDPC) code. The error correction circuitry 188 may include an encoder and/or a decoder to perform an error correction operation based on the low density parity check (LDPC) code. The LDPC code can be generally classified into a random LDPC code, a structural LDPC code generated on a block basis, and a semi-random LDPC code. Unlike the random LDPC code, a structural code can be generated by an algebraic or geometric method. The structural code on a block basis may include a parity check matrix (H matrix) with a sub-matrix or a zero-matrix having a column weight and a row weight of 1. For example, the structural code can be classified into a regular LDPC code and an irregular LDPC code according to weights of the column and row.

Because a parity check matrix (H Matrix) of the random LDPC code is randomly generated, transmission/reception circuitry of the controller 130 and the memory device 150 in the memory system 110 stores all the parity check matrix (H Matrix) in order to satisfy various frame sizes and code rates. On the other hand, in the structural LDPC code, a parity check matrix (H Matrix) can be generated based on a preset rule, so that the transmission/reception circuitry of the controller 130 and the memory device 150 do not have to store all the parity check matrix (H Matrix). Further, the parity check matrix (H Matrix) can be easily created based on a frame size and a code rate. However, it might be difficult to generate a parity check matrix (H Matrix) that satisfies all frame sizes and code rates due to a limitation in generating a parity check matrix (H Matrix) for a structural LDPC code. The semi-random LDPC code may randomly generate a part of the parity check matrix (H Matrix) and the other part may be generated based on a preset rule, so that a large storage space may not be required because the transmission/reception circuitry of the controller 130 and the memory device 150 do not have to store the entire parity check matrix (H Matrix). Example encoding operations using a low-density parity check (LDPC) code will be described below in detail with reference to FIGS. 5 to 10.

In an embodiment of the disclosed technology, an apparatus and a method can be provided to reduce the amount of computation associated with the error correction circuitry 188 using the low-density parity check (LDPC) code. The parity check matrix H Matrix may include a plurality of matrices. The error correction circuitry 188 can multiply an input data by a first matrix to generate a first result obtained by multiplying data by a first matrix, divide a parity into a first parity group, obtained by multiplying the first result by a second matrix, and a second parity group, obtained by an exclusive OR operation of the first result and the first parity group, based on a plurality of polynomials generated multiplying the first result by the second matrix. The error correction circuitry 188 can perform a matrix multiplication for obtaining the first parity group but perform a logical operation (e.g., an exclusive OR operation) to obtain the second parity group. After performing the computation to obtain the first and second parity groups, the error correction circuitry 188 can combine the parity, including the first and second parity groups, with the data to generate a codeword. The error correction circuitry 188 can transmit the codeword to the memory device 150.

In some embodiments of the disclosed technology, the data input to the error correction circuitry 188 may include what is transmitted from an external device, and may also include data or data packets processed by the randomizer 184 and the Link Cyclic Redundancy Code (LCRC) circuitry 186. In some implementations, the error correction circuitry 188 using the low-density parity check (LDPC) code can calculate K-bit input data based on a parity check matrix (H Matrix) to generate a M-bit parity, and then sums the K-bit data and the M-bit parity to output a N-Bit codeword (N=K+M).

Hereinafter, a flash translation layer (FTL) 240 in the controller 130 will be described in more detail with reference to FIGS. 3 to 4.

Figure 2:
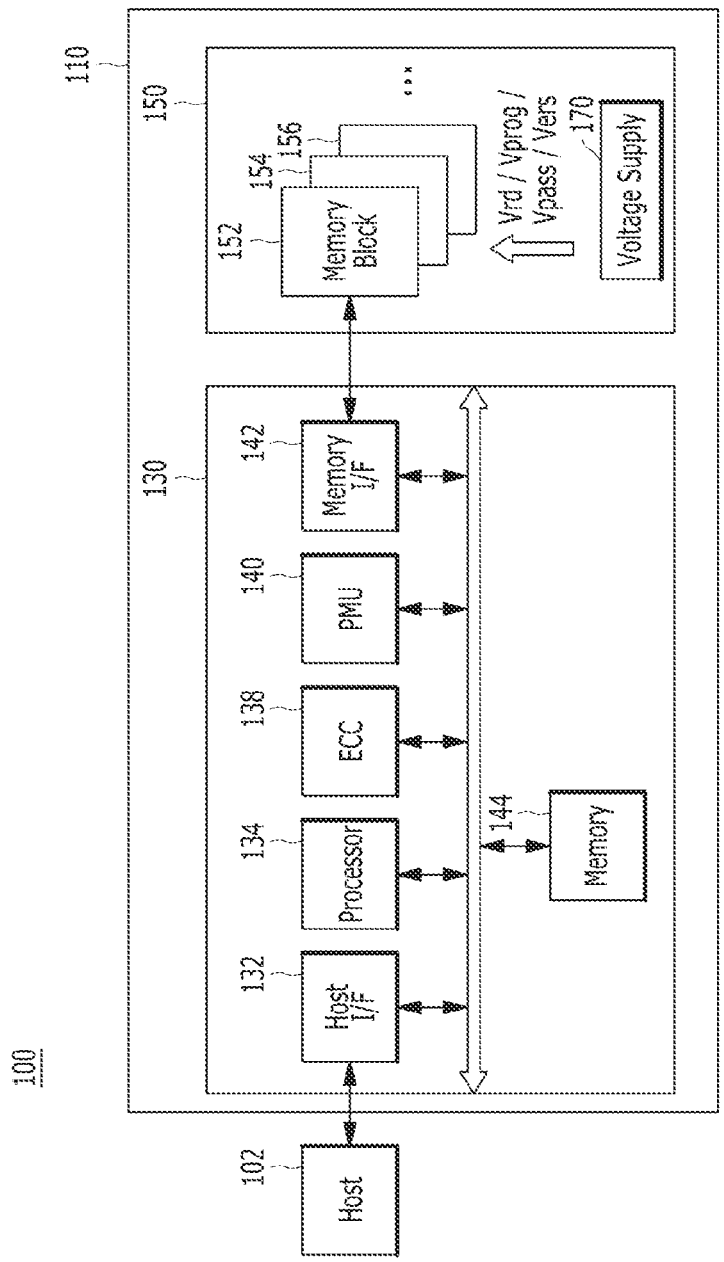
FIG. 2 illustrates an example of a data processing system based on some embodiments of the disclosed technology.
Figure 3:
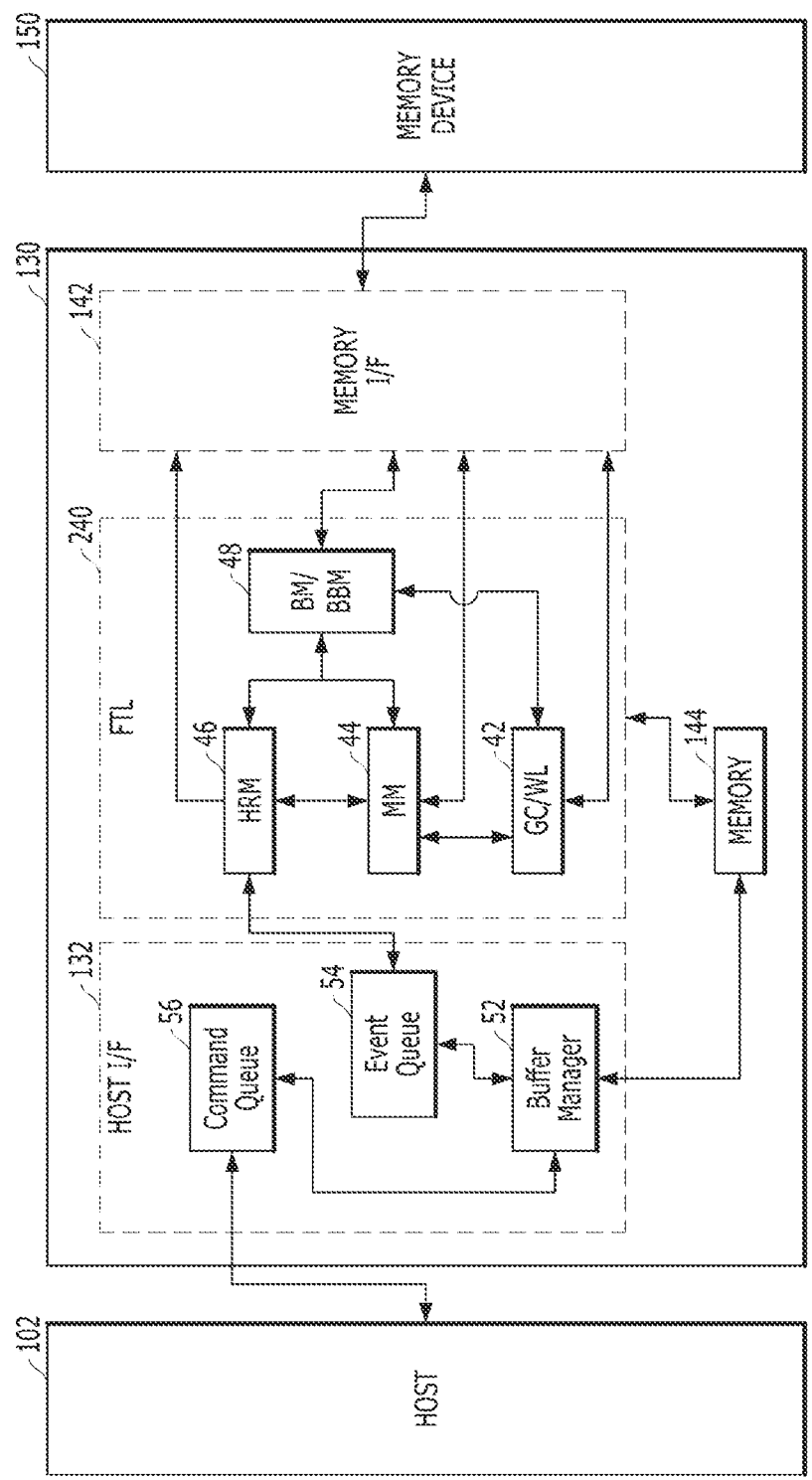
FIG. 3 illustrates an example of a memory system based on some embodiments of the disclosed technology.

FIGS. 2 and 3 illustrate example configurations that may be used to implement the disclosed technology by the memory system 110 based on some embodiments of the disclosed technology.

Referring to FIG. 2, the data processing system 100 may include a host 102 coupled with a memory system, such as memory system 110. For example, the host 102 and the memory system 110 can be coupled to each other via a data bus, a host cable or others to perform data communication.

The memory system 110 may include a memory device 150 and a controller 130. The memory device 150 and the controller 130 in the memory system 110 may include components or elements physically separated from each other. The memory device 150 and the controller 130 may be connected via at least one data path. For example, the data path may include channels and/or ways.

In some embodiments of the disclosed technology, the memory device 150 and the controller 130 may be components or elements that are functionally divided. Further, in some embodiments of the disclosed technology, the memory device 150 and the controller 130 may be implemented with a single chip or a plurality of chips. The controller 130 may perform a data input/output operation in response to a request from the external device. For example, when the controller 130 performs a read operation in response to a read request from an external device, data stored in a plurality of non-volatile memory cells included in the memory device 150 is transferred to the controller 130.

As shown in FIG. 1, the memory device 150 may include a plurality of memory blocks 152, 154, 156. The memory block 152, 154, 156 may include a group of non-volatile memory cells in which data is removed together by a single erase operation. Although not illustrated, the memory block 152, 154, 156 may include a plurality of pages, which is a group of non-volatile memory cells that store data together during a single program operation or output data together during a single read operation. For example, one memory block may include a plurality of pages.

For example, the memory device 150 may include a plurality of memory planes or a plurality of memory chip dies. In some embodiments of the disclosed technology, the memory plane may include a logical or a physical partition including at least one memory block, a driving circuit for controlling an array including a plurality of non-volatile memory cells, and a buffer that can temporarily store data inputted to, or outputted from, non-volatile memory cells.

In addition, in some embodiments of the disclosed technology, the memory chip die may include at least one memory plane. The memory chip die may include a set of components implemented on a physically distinguishable substrate. Each memory chip die may be connected to the controller 130 through a data path (e.g., a channel). Each memory chip die may include an interface to exchange data and other signals with the controller 130.

In some embodiments of the disclosed technology, the memory device 150 may include at least one memory block 152, 154, 156, at least one memory plane, or at least one memory chip die. For example, each plane can include plural memory blocks, and each plane can be coupled to a channel via each way. The internal configuration of the memory device 150 shown in FIG. 1 may vary depending on the performance of the memory system 110.

Referring to FIG. 2, the memory device 150 may include a voltage supply circuit for supplying at least some voltage into the memory block 152, 154, 156. The voltage supply circuit may supply a read voltage Vrd, a program voltage Vprog, a pass voltage Vpass, or an erase voltage Vers into a non-volatile memory cell included in the memory block. For example, during a read operation for reading data stored in the non-volatile memory cell included in the memory block 152, 154, 156, the voltage supply circuit may apply the read voltage Vrd to a selected non-volatile memory cell. During the program operation for storing data in the non-volatile memory cell included in the memory block 152, 154, 156, the voltage supply circuit may apply the program voltage Vprog to a selected non-volatile memory cell. Also, during a read operation or a program operation performed on the selected nonvolatile memory cell, the voltage supply circuit may apply a pass voltage Vpass to a non-selected nonvolatile memory cell. During the erasing operation for erasing data stored in the non-volatile memory cell included in the memory block 152, 154, 156, the voltage supply circuit may apply the erase voltage Vers to the memory block.

The memory device 150 may store information regarding various voltages that are applied to the memory block 152, 154, 156 depending on the operations. For example, when a non-volatile memory cell in the memory block 152, 154, 156 can store multi-bit data, plural levels of the read voltage Vrd for recognizing or reading the multi-bit data may be required. The memory device 150 may include a mapping table including different voltage levels as the read voltage Vrd. For example, the table can include voltage values corresponding to the read voltage Vrd to be applied to read out a certain data bit of the multi-bit data and such voltage values can be stored in a register. The number of voltage values for the read voltage Vrd that is used for a read operation may be limited to a preset range. Also, the voltage values can be quantized.

The host 102 may include a portable electronic device (e.g., a mobile phone, an MP3 player, a laptop computer, etc.) or a non-portable electronic device (e.g., a desktop computer, a game player, a television, a projector, etc.).

The host 102 may also include at least one operating system (OS) to control functions and operations performed in the host 102. The OS can provide interoperability between the host 102 engaged operatively with the memory system 110 and a user who intends to store data in the memory system 110. The OS may support functions and operations corresponding to user's requests. By the way of example but not limitation, the OS can be classified into a general operating system and a mobile operating system according to mobility of the host 102. The general operating system may be split into a personal operating system and an enterprise operating system according to system requirements or a user environment. As compared with the personal operating system, the enterprise operating systems can be specialized for securing and supporting high performance computing.

The mobile operating system may be subject to support services or functions for mobility (e.g., a power saving function). The host 102 may include a plurality of operating systems. The host 102 may execute multiple operating systems interlocked with the memory system 110, corresponding to a user's request. The host 102 may transmit a plurality of commands corresponding to the user's requests into the memory system 110, thereby performing operations corresponding to the plurality of commands within the memory system 110.

A controller 130 in the memory system 110 may control a memory device 150 in response to a request or a command input from the host 102. For example, the controller 130 may perform a read operation to provide data read from the memory device 150 to the host 102 and may perform a write operation (or a program operation) to store data input from the host 102 in the memory device 150. In order to perform data input/output (I/O) operations, the controller 130 may control and manage internal operations of reading data, programming data, erasing data, or the like.

In some embodiments of the disclosed technology, the controller 130 may include a host interface 132, a processor 134, error correction circuitry (ECC) 138, a power management unit (PMU) 140, a memory interface 142, and a memory 144. Components included in the controller 130 as illustrated in FIG. 2 may vary according to structures, functions, operation performance, or the like, regarding the memory system 110.

For example, the memory system 110 may be implemented with any of various types of storage devices electrically coupled with the host 102, according to a protocol of a host interface. Examples of suitable storage devices include a solid state drive (SSD), a multimedia card (MMC), an embedded MMC (eMMC), a reduced size MMC (RS-MMC), a micro-MMC, a secure digital (SD) card, a mini-SD, a micro-SD, a universal serial bus (USB) storage device, a universal flash storage (UFS) device, a compact flash (CF) card, a smart media (SM) card, a memory stick, and the like. Components may be added to or omitted from the controller 130 according to implementation of the memory system 110.

The host 102 and the memory system 110 each may include a controller or an interface for transmitting and receiving signals, data, and the like, in accordance with one or more predetermined protocols. For example, the host interface 132 in the memory system 110 may include an apparatus capable of transmitting signals, data, and the like to the host 102 or receiving signals, data, and the like from the host 102.

The host interface 132 included in the controller 130 may receive signals, commands (or requests), and/or data input from the host 102. For example, the host 102 and the memory system 110 may use a predetermined protocol to transmit and receive data therebetween. Examples of protocols or interfaces supported by the host 102 and the memory system 110 for sending and receiving data include Universal Serial Bus (USB), Multi-Media Card (MMC), Parallel Advanced Technology Attachment (PATA), Small Computer System Interface (SCSI), Enhanced Small Disk Interface (ESDI), Integrated Drive Electronics (IDE), Peripheral Component Interconnect Express (PCIE), Serial-attached SCSI (SAS), Serial Advanced Technology Attachment (SATA), Mobile Industry Processor Interface (MIPI), and the like. In some embodiments of the disclosed technology, the host interface 132 is a kind of layer for exchanging data with the host 102 and is implemented with, or driven by, firmware called a host interface layer (HIL).

The Integrated Drive Electronics (IDE) or Advanced Technology Attachment (ATA) may be used as one of the interfaces for transmitting and receiving data and, for example, may use a cable including 40 wires connected in parallel to support data transmission and data reception between the host 102 and the memory system 110. When a plurality of memory systems 110 are connected to a single host 102, the plurality of memory systems 110 may be divided into a master and a slave by using a position or a dip switch to which the plurality of memory systems 110 are connected. The memory system 110 set as the master may be used as a main memory device. The IDE (ATA) may include, for example, Fast-ATA, ATAPI, or Enhanced IDE (EIDE).

A Serial Advanced Technology Attachment (SATA) interface is a kind of serial data communication interface that is compatible with various ATA standards of parallel data communication interfaces which are used by Integrated Drive Electronics (IDE) devices. The 40 wires in the IDE interface can be reduced to six wires in the SATA interface. For example, 40 parallel signals for the IDE can be converted into 6 serial signals for the SATA interface. The SATA interface has been widely used because of its faster data transmission and reception rate and its less resource consumption in the host 102 used for the data transmission and reception. The SATA interface may connect up to 30 external devices to a single transceiver included in the host 102. In addition, the SATA interface can support hot plugging that allows an external device to be attached to or detached from the host 102, even while data communication between the host 102 and another device is being executed. Thus, the memory system 110 can be connected or disconnected as an additional device, like a device supported by a universal serial bus (USB) even when the host 102 is powered on. For example, in the host 102 having an eSATA port, the memory system 110 may be freely attached to or detached from the host 102 like an external hard disk.

Small Computer System Interface (SCSI) is a kind of serial data communication interface used for connecting a computer or a server with other peripheral devices. The SCSI can provide a high transmission speed, as compared with other interfaces such as IDE and SATA. In the SCSI, the host 102 and at least one peripheral device (e.g., memory system 110) are connected in series, but data transmission and reception between the host 102 and each peripheral device may be performed through a parallel data communication. In the SCSI, it is easy to connect or disconnect a device such as the memory system 110 to or from the host 102. The SCSI can support connections of 15 other devices to a single transceiver included in host 102.

Serial Attached SCSI (SAS) can include a serial data communication version of the SCSI. In the SAS, the host 102 and a plurality of peripheral devices are connected in series, and data transmission and reception between the host 102 and each peripheral device may be performed in a serial data communication scheme. The SAS can support connection between the host 102 and the peripheral device through a serial cable instead of a parallel cable, to easily manage equipment using the SAS and enhance or improve operational reliability and communication performance. The SAS may support connections of eight external devices to a single transceiver included in the host 102.

The Non-volatile memory express (NVMe) is a kind of interface based at least on a Peripheral Component Interconnect Express (PCIe) designed to increase performance and design flexibility of the host 102, servers, computing devices, and the like equipped with the non-volatile memory system 110. The PCIe can use a slot or a specific cable for connecting a computing device (e.g., host 102) and a peripheral device (e.g., memory system 110). For example, the PCIe can use a plurality of pins (e.g., 18 pins, 32 pins, 49 pins, or 82 pins) and at least one wire (e.g., ×1, ×4, ×8, or ×16) to achieve high speed data communication over several hundred MB per second (e.g., 250 MB/s, 500 MB/s, 984.6250 MB/s, or 1969 MB/s). In some embodiments of the disclosed technology, the PCIe scheme may achieve bandwidths of tens to hundreds of Giga bits per second. The NVMe can support an operation speed of the non-volatile memory system 110, such as an SSD, that is faster than a hard disk.

In some embodiments of the disclosed technology, the host 102 and the memory system 110 may be connected through a universal serial bus (USB). The Universal Serial Bus (USB) is a kind of scalable, hot-pluggable plug-and-play serial interface that can provide cost-effective standard connectivity between the host 102 and peripheral devices such as a keyboard, a mouse, a joystick, a printer, a scanner, a storage device, a modem, a video camera, and the like. A plurality of peripheral devices such as the memory system 110 may be coupled to a single transceiver included in the host 102.

Referring to FIG. 2, the error correction circuitry 138 can correct error bits of data read from the memory device 150, and may include an error correction code (ECC) encoder and an ECC decoder. The ECC encoder may perform an error correction encoding on data to be programmed in the memory device 150 to generate encoded data by adding one or more parity bits to the data, and store the encoded data in memory device 150. The ECC decoder can detect and correct error bits contained in the data read from the memory device 150 when the controller 130 reads the data stored in the memory device 150. For example, after performing the error correction decoding on the data read from the memory device 150, the error correction circuitry 138 determines whether the error correction decoding has succeeded or not, and outputs an instruction signal (e.g., a correction success signal or a correction fail signal), based on a result of the error correction decoding. The error correction circuitry 138 may use one or more parity bits that are generated during the ECC encoding process for the data stored in the memory device 150 to correct the error bits of the read data. When the number of the error bits exceeds the maximum number of correctable error bits, the error correction circuitry 138 may not correct the error bits and instead may output the correction fail signal indicating failure in correcting the error bits.

In some embodiments of the disclosed technology, the error correction circuitry 138 may perform an error correction operation based on a coded modulation such as a low density parity check (LDPC) code, a Bose-Chaudhuri-Hocquenghem (BCH) code, a turbo code, a Reed-Solomon (RS) code, a convolution code, a recursive systematic code (RSC), a trellis-coded modulation (TCM), a Block coded modulation (BCM), or the like. The error correction circuitry 138 may include all circuits, modules, systems, and/or devices for performing the error correction operation based on at least one of the above described codes. The error correction circuitry 138 shown in FIG. 2 can include at least some of components included in the controller 130 shown in FIG. 1.

For example, the ECC decoder may perform hard decision decoding or soft decision decoding on data transmitted from the memory device 150. The hard decision decoding can include one of two methods broadly classified for error correction. The hard decision decoding may include an operation of correcting an error bit by reading digital data of '0' or '1' from a non-volatile memory cell in the memory device 150. Because the hard decision decoding handles a binary logic signal, the circuit/algorithm of the ECC encoder/decoder may have a simpler design or configuration and a processing speed may be faster than the soft decision decoding.

The soft decision decoding may quantize a threshold voltage of a non-volatile memory cell in the memory device 150 by two or more quantized values (e.g., multiple bit data, approximate values, an analog value, and the like) in order to correct an error bit based on the two or more quantized values. The controller 130 can receive two or more alphabets or quantized values from a plurality of non-volatile memory cells in the memory device 150, and then perform a decoding based on information generated by characterizing the quantized values as a combination of information such as conditional probability or likelihood.

In some embodiments of the disclosed technology, the ECC decoder may use low-density parity-check and generator matrix (LDPC-GM) code that may be designed to perform soft decision decoding. The low-density parity-check (LDPC) code uses an algorithm that can read values of data from the memory device 150 in several bits according to reliability, not simply data of 1 or 0 like the hard decision decoding, and iteratively repeat it through a message exchange in order to improve reliability of the values. Then, the values are finally determined as data of 1 or 0. For example, a decoding algorithm using LDPC codes can include probabilistic decoding. The hard decision decoding in which a value output from a non-volatile memory cell is coded as 0 or 1. Compared to the hard decision decoding, the soft decision decoding can determine the value stored in the non-volatile memory cell based on the stochastic information. Regarding bit-flipping (which may include an error that can occur in the memory device 150), the soft decision decoding may provide improved probability of correcting the error and recovering data, as well as providing reliability and stability of corrected data. The LDPC-GM code may have a scheme in which internal LDGM codes can be concatenated in series with high-speed LDPC codes.

In some embodiments of the disclosed technology, the ECC decoder may use, for example, low-density parity-check convolutional codes (LDPC-CCs) for the soft decision decoding. The LDPC-CCs may have a scheme using a linear time encoding and a pipeline decoding based on a variable block length and a shift register.

In some embodiments of the disclosed technology, the ECC decoder may use, for example, a Log Likelihood Ratio Turbo Code (LLR-TC) for the soft decision decoding. A Log Likelihood Ratio (LLR) may be calculated as a non-linear function for a distance between a sampled value and an ideal value. In addition, a Turbo Code (TC) may include a simple code (e.g., a Hamming code) in two or three dimensions and repeat decoding in a row direction and a column direction to improve reliability of values.

The power management unit (PMU) 140 may control electrical power provided to the controller 130. The PMU 140 may monitor the electrical power supplied to the memory system 110 (e.g., a voltage supplied to the controller 130) and provide the electrical power to components included in the controller 130. The PMU 140 may not only detect power-on or power-off, but also generate a trigger signal to enable the memory system 110 to back up a current state urgently when the electrical power supplied to the memory system 110 is unstable. In some embodiments of the disclosed technology, the PMU 140 may include a device or a component capable of accumulating electrical power that may be used in an emergency.

The memory interface 142 may serve as an interface for handling commands and data transferred between the controller 130 and the memory device 150, in order to allow the controller 130 to control the memory device 150 in response to a command or a request from the host 102. The memory interface 142 may generate a control signal for the memory device 150 and may process data input to, or output from, the memory device 150 under the control of the processor 134 in a case when the memory device 150 is a flash memory.

For example, when the memory device 150 includes a NAND flash memory, the memory interface 142 includes a NAND flash controller (NFC). The memory interface 142 can provide an interface for handling commands and data between the controller 130 and the memory device 150. In accordance with an embodiment, the memory interface 142 can be implemented through, or driven by, firmware called a Flash Interface Layer (FIL) for exchanging data with the memory device 150.

In some embodiments of the disclosed technology, the memory interface 142 may support an open NAND flash interface (ONFi), a toggle mode, or the like, for data input/output with the memory device 150. For example, the ONFi may use a data path (e.g., a channel, a way, etc.) that includes at least one signal line that supports bi-directional transmission and reception in a unit of 8-bit or 16-bit data. Data communication between the controller 130 and the memory device 150 can be achieved through at least one interface regarding an asynchronous single data rate (SDR), a synchronous double data rate (DDR), a toggle double data rate (DDR), or others.

The memory 144 may be used as a working memory of the memory system 110 or the controller 130, while temporarily storing transactional data of operations performed in the memory system 110 and the controller 130. For example, the memory 144 may temporarily store read data output from the memory device 150 in response to a read request from the host 102 before the read data is output to the host 102. In addition, the controller 130 may temporarily store write data input from the host 102 in the memory 144 before programming the write data in the memory device 150. When the controller 130 controls operations, such as a data read operation, a data write or program operation, a data erase operation of the memory device 150, data transmitted between the controller 130 and the memory device 150 of the memory system 110 may be temporarily stored in the memory 144.

In addition to the read data or write data, the memory 144 may store information (e.g., map data, read requests, program requests, etc.) used for inputting or outputting data between the host 102 and the memory device 150. In some embodiments of the disclosed technology, the memory 144 may include one or more command queues, a program memory, a data memory, a write buffer/cache, a read buffer/cache, a data buffer/cache, a map buffer/cache, and so on. The controller 130 may allocate some storage space in the memory 144 for a component which is established to carry out a data input/output operation. For example, the write buffer established in the memory 144 may be used to temporarily store target data subject to a program operation.

In an embodiment, the memory 144 may be implemented with a volatile memory. For example, the memory 144 may be implemented with a static random access memory (SRAM), a dynamic random access memory (DRAM), or both. Although FIG. 2 illustrates the memory 144 as disposed within the controller 130, the memory 144 may be disposed outside the controller 130. For instance, the memory 144 may be embodied by an external volatile memory having a memory interface transferring data and/or signals between the memory 144 and the controller 130.

The processor 134 may control the overall operations of the memory system 110. For example, the processor 134 can control a program operation or a read operation of the memory device 150 in response to a write request or a read request entered from the host 102. In some embodiments of the disclosed technology, the processor 134 may execute firmware to control the program operation or the read operation in the memory system 110. Herein, the firmware may be referred to as a flash translation layer (FTL). An example of the FTL will be described in detail, referring to FIGS. 3 and 4. In some embodiments of the disclosed technology, the processor 134 may be implemented with a microprocessor, a central processing unit (CPU), or the like.

In some embodiments of the disclosed technology, the memory system 110 may be implemented with at least one multi-core processor. The multi-core processor is a kind of circuit or chip in which two or more cores, which are considered distinct processing regions, are integrated. For example, when a plurality of cores in the multi-core processor drive or execute a plurality of flash translation layers (FTLs) independently, a data input/output speed (or performance) of the memory system 110 may be improved. Based on some embodiments of the disclosed technology, the data input/output (I/O) operations in the memory system 110 may be independently performed through different cores in the multi-core processor.

The processor 134 in the controller 130 may perform an operation corresponding to a request or a command input from the host 102. Further, the memory system 110 may perform an operation independent from a command or a request from the host 102. In one case, an operation performed by the controller 130 in response to the request or the command input from the host 102 may include a foreground operation, while an operation performed by the controller 130 independently from the request or the command input from the host 102 may include a background operation. The controller 130 can perform foreground or background operations for reading, writing, or erasing data in the memory device 150. In addition, a parameter set operation corresponding to a set parameter command or a set feature command as a set command transmitted from the host 102 may include a foreground operation. As a background operation that is performed without a command transmitted from the host 102, the controller 130 can perform garbage collection (GC), wear leveling (WL), bad block management for identifying and processing bad blocks, or others.

In some embodiments, substantially similar operations may be performed as both the foreground operation and the background operation. For example, when the memory system 110 performs garbage collection in response to a request or a command input from the host 102 (e.g., Manual GC), the garbage collection can include a foreground operation. When the memory system 110 performs garbage collection independently of the host 102 (e.g., Auto GC), the garbage collection can include a background operation.

When the memory device 150 includes a plurality of semiconductor chip dies each including a plurality of non-volatile memory cells, the controller 130 may perform a parallel processing regarding plural requests or commands input from the host 102 in order to improve performance of the memory system 110. For example, the transmitted requests or commands may be divided into plural groups including at least some of a plurality of planes, a plurality of dies, or a plurality of chips included in the memory device 150, and the plural groups of requests or commands are processed individually or in parallel in each plane, each die or each chip.

The memory interface 142 in the controller 130 may be connected to the plurality of dies or chips in the memory device 150 through at least one channel and at least one way. When the controller 130 distributes and stores data in the plurality of dies through each channel or each way in response to requests or commands associated with a plurality of pages including non-volatile memory cells, a plurality of operations corresponding to the requests or the commands can be performed simultaneously or in parallel with respect to the plurality of dies or planes. Such a processing method or scheme can include an interleaving method. Because a data input/output speed of the memory system 110 increases by operating with the interleaving method, data I/O performance of the memory system 110 can be improved.

By the way of example but not limitation, the controller 130 can recognize statuses of a plurality of channels (or ways) associated with the plurality of dies included in the memory device 150. The controller 130 may determine a status of each channel or each way as one of a busy status, a ready status, an active status, an idle status, a normal status, and an abnormal status. The determination of which channel or way an instruction (and/or a data) is delivered through by the controller can be associated with a physical block address. The controller 130 may include descriptors delivered from the memory device 150. The descriptors may include a block or page of parameters describing something about the memory device 150. The descriptors can have a predetermined format or structure. For instance, the descriptors may include device descriptors, configuration descriptors, unit descriptors, and the like. The controller 130 may use the descriptors to determine which channel(s) is used to exchange an instruction or data.

Referring to FIG. 2, the memory device 150 in the memory system 110 may include a plurality of memory blocks 152, 154, 156. Each of the plurality of memory blocks 152, 154, 156 includes a plurality of non-volatile memory cells. Based on some embodiments of the disclosed technology, the memory block 152, 154, 156 can be a group of non-volatile memory cells erased together. The memory block 152, 154, 156 may include a plurality of pages each of which includes a group of non-volatile memory cells read or programmed together.

In one embodiment, each memory block 152, 154, or 156 may have a three-dimensional stack structure. Further, the memory device 150 may include a plurality of dies, each die including a plurality of planes, each plane including the plurality of memory blocks 152, 154, 156. The configuration of the memory device 150 may vary depending on the required performance of the memory system 110.

FIG. 2 illustrates the memory device 150 that includes the plurality of memory blocks 152, 154, and 156. The plurality of memory blocks 152, 154, and 156 may be any of single-level cell (SLC) memory blocks, multi-level cell (MLC) memory blocks, or the like, according to the number of bits that can be stored in one memory cell. An SLC memory block includes a plurality of pages implemented by memory cells, each memory cell storing one bit of data. An SLC memory block may have higher data I/O operation performance and higher durability than the MLC memory block. The MLC memory block includes a plurality of pages implemented by memory cells, each memory cell storing multi-bit data (e.g., two or more bits of data). The MLC memory block may have larger storage capacity for the same space compared to the SLC memory block. The MLC memory block can be highly integrated in a view of storage capacity.

In an embodiment, the memory device 150 may be implemented with MLC memory blocks such as a double level cell (DLC) memory block, a triple-level cell (TLC) memory block, a quadruple-level cell (QLC) memory block, and a combination thereof. The DLC memory block may include a plurality of pages implemented by memory cells, each memory cell capable of storing 2-bit data. The TLC memory block can include a plurality of pages implemented by memory cells, each memory cell capable of storing 3-bit data. The QLC memory block can include a plurality of pages implemented by memory cells, each memory cell capable of storing 4-bit data. In another embodiment, the memory device 150 can be implemented with a block including a plurality of pages implemented by memory cells, each memory cell capable of storing five or more bits of data.

In some embodiments of the disclosed technology, the controller 130 may use an MLC memory block included in the memory device 150 as an SLC memory block that stores one-bit data per memory cell. A data input/output speed of the multi-level cell (MLC) memory block can be slower than that of the SLC memory block. That is, when the MLC memory block is used as the SLC memory block, a margin for a read or program operation can be reduced. For example, the controller 130 may perform a data input/output operation with a higher speed when the MLC memory block is used as the SLC memory block. Thus, the controller 130 may use the MLC memory block as a SLC buffer to temporarily store data because the buffer may require a high data input/output speed.

Further, in some embodiments of the disclosed technology, the controller 130 can program data in an MLC a plurality of times without performing an erase operation on a specific MLC memory block included in the memory device 150. In general, non-volatile memory cells do not support data overwrite. However, the controller 130 may program 1-bit data in the MLC multiple times using a feature in which the MLC is capable of storing multi-bit data. For an MLC overwrite operation, the controller 130 may store the number of iterations of program operations as separate operation information when 1-bit data is programmed in an MLC. In some embodiments of the disclosed technology, threshold voltages of the MLCs may be distributed evenly before other 1-bit data can be programmed in the same MLCs.

In an embodiment, the memory device 150 include a non-volatile memory such as a flash memory, for example, a NAND flash memory or a NOR flash memory. In another embodiment, the memory device 150 may include at least one of a phase-change random access memory (PCRAM), a ferroelectrics random access memory (FRAM), a transfer torque random access memory (STT-RAM), and a spin transfer torque magnetic random access memory (STT-MRAM), or others.

Referring to FIG. 3, the controller 130 in a memory system operates along with the host 102 and the memory device 150. As illustrated, the controller 130 includes the host interface 132, a flash translation layer (FTL) 240, the memory interface 142, and the memory 144.

In some embodiments of the disclosed technology, the error correction circuitry 138 illustrated in FIG. 2 may be included in the flash translation layer (FTL) 240. In another embodiment, the error correction circuitry 138 may include a separate module, a circuit, firmware, or others that is included in or associated with the controller 130.

The host interface 132 may handle commands, data, and other signals transmitted from the host 102. By way of example but not limitation, the host interface 132 may include a command queue 56, a buffer manager 52, and an event queue 54. The command queue 56 may sequentially store the commands, the data, and the like received from the host 102, and output them to the buffer manager 52, for example, in an order in which they are stored in the command queue 56. The buffer manager 52 may classify, manage, or adjust the commands, the data, and the like received from the command queue 56. The event queue 54 may sequentially transmit events for processing the commands, the data, and the like received from the buffer manager 52.

A plurality of commands or data of the same characteristic may be transmitted from the host 102, or a plurality of commands and data of different characteristics may be transmitted to the memory system 110 after being mixed or jumbled by the host 102. For example, a plurality of commands for reading data, i.e., read commands, may be delivered, or commands for reading data, i.e., a read command, and a command for programming/writing data, i.e., a write command, may be alternately transmitted to the memory system 110. The host interface 132 may sequentially store commands, data, and other signals that are transmitted from the host 102, in the command queue 56. Thereafter, the host interface 132 may estimate or predict what kind of internal operations the controller 130 will perform according to the characteristics of the commands, the data, and the like, which have been transmitted from the host 102. The host interface 132 may determine a processing order and a priority of commands, data and other signals based on their characteristics.

Based on the characteristics of the commands and the data transmitted from the host 102, the buffer manager 52 in the host interface 132 is configured to determine whether the buffer manager 52 should store the commands and the data in the memory 144, or whether the buffer manager 52 should deliver the commands and the data to the flash translation layer (FTL) 240. The event queue 54 receives events, transmitted from the buffer manager 52, which are to be internally executed and processed by the memory system 110 or the controller 130 in response to the commands, the data, and the like, and delivers the events to the flash translation layer (FTL) 240 in the order of the events inputting to the event queue 54.

In an embodiment, the flash translation layer (FTL) 240 illustrated in FIG. 3 may implement a multi-thread scheme to perform data input/output (I/O) operations. A multi-thread FTL may be implemented through a multi-core processor using multi-thread included in the controller 130.

In an embodiment, the flash translation layer (FTL) 240 may include a host request manager (HRM) 46, a map manager (MM) 44, a state manager 42, and a block manager 48. The host request manager (HRM) 46 may manage the events transmitted from the event queue 54. The map manager (MM) 44 may handle or control map data. The state manager 42 may perform garbage collection (GC) or wear leveling (WL). The block manager 48 may execute commands or instructions onto a block in the memory device 150.

By way of example but not limitation, the host request manager (HRM) 46 may use the map manager (MM) 44 and the block manager 48 to handle or process requests according to read and program commands and events which are delivered from the host interface 132. The host request manager (HRM) 46 may send an inquiry request to the map manager (MM) 44 to determine a physical address corresponding to a logical address which is entered with the events. The host request manager (HRM) 46 may send a read request with the physical address to the memory interface 142 to process the read request, i.e., handle the events. In one embodiment, the host request manager (HRM) 46 may send a program request (or a write request) to the block manager 48 to program data to a specific empty page storing no data in the memory device 150, and then may transmit a map update request corresponding to the program request to the map manager (MM) 44 in order to update an item relevant to the programmed data in information of mapping the logical and physical addresses to each other.

The block manager 48 may convert a program request delivered from the host request manager (HRM) 46, the map manager (MM) 44, and/or the state manager 42 into a flash program request used for the memory device 150, in order to manage flash blocks in the memory device 150. In order to maximize or enhance program or write performance of the memory system 110, the block manager 48 may collect program requests and send flash program requests for multiple-plane and one-shot program operations to the memory interface 142. In an embodiment, the block manager 48 sends several flash program requests to the memory interface 142 to enhance or maximize parallel processing of a multi-channel and multi-directional flash controller.

In one embodiment, the block manager 48 may manage blocks in the memory device 150 according to the number of valid pages, select and erase blocks having no valid pages when a free block is needed, and select a block including the least number of valid pages when it is determined that garbage collection is to be performed. The state manager 42 may perform garbage collection to move valid data stored in the selected to an empty block and erase data stored in the selected block so that the memory device 150 may have enough free blocks (i.e., empty blocks with no data). When the block manager 48 provides information regarding a block to be erased to the state manager 42, the state manager 42 may check all flash pages of the block to be erased to determine whether each page of the block is valid.

For example, to determine validity of each page, the state manager 42 may identify a logical address recorded in an out-of-band (OOB) area of each page. To determine whether each page is valid, the state manager 42 may compare a physical address of the page with a physical address mapped to a logical address obtained from an inquiry request. The state manager 42 sends a program request to the block manager 48 for each valid page. A map table may be updated by the map manager 44 when a program operation is complete.

The map manager 44 may manage map data, e.g., a logical-physical map table. The map manager 44 may process various requests, for example, queries, updates, and the like, which are generated by the host request manager (HRM) 46 or the state manager 42. The map manager 44 may store the entire map table in the memory device 150 (e.g., a flash/non-volatile memory) and cache mapping entries according to the storage capacity of the memory 144. When a map cache miss occurs while processing inquiry or update requests, the map manager 44 may send a read request to the memory interface 142 to load a relevant map table stored in the memory device 150. When the number of dirty cache blocks in the map manager 44 exceeds a certain threshold value, a program request may be sent to the block manager 48, so that a clean cache block is made and a dirty map table may be stored in the memory device 150.

When garbage collection is performed, the state manager 42 copies valid page(s) into a free block, and the host request manager (HRM) 46 may program the latest version of the data for the same logical address of the page and currently issue an update request. When the state manager 42 requests the map update in a state in which the copying of the valid page(s) is not completed normally, the map manager 44 might not perform the map table update. This is because the map request is issued with old physical information when the state manger 42 requests a map update and a valid page copy is completed later. The map manager 44 may perform a map update operation to ensure accuracy when, or only if, the latest map table still points to the old physical address.

Figure 4:
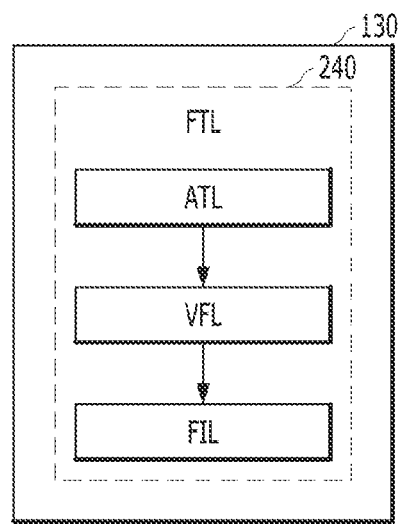
FIG. 4 illustrates an example configuration of a controller shown in FIGS. 1 to 3.

FIG. 4 illustrates an example configuration of the controller shown in FIGS. 1 to 3.

Referring to FIG. 4, the flash translation layer (FTL) 240 in the controller 130 can be divided into three layers: an address translation layer ATL; a virtual flash layer VFL; and a flash Interface Layer FIL.

For example, the address translation layer ATL may convert a logical address LA transmitted from a file system into a logical page address. The address translation layer ATL can perform an address translation process regarding a logical address space. That is, the address translation layer ATL can perform an address translation process based on mapping information to which the logical page address LPA of the flash memory 140 is mapped to the logical address LA transmitted from the host. Such logical-to-logical address mapping information (hereinafter referred to as L2L mapping) may be stored in an area in which metadata is stored in the memory device 150.

The virtual flash layer VFL may convert the logical page address LPA, which is mapped by the address translation layer ATL, into a virtual page address VPA. Here, the virtual page address VPA may correspond to a physical address of a virtual memory device. That is, the virtual page address VPA may correspond to the memory block 60 in the memory device 150. If there is a bad block among the memory blocks 60 in the memory device 150, the bad block may be excluded by the virtual flash layer VFL. In addition, the virtual flash layer VFL can include a recovery algorithm for scanning a scan area to restore the logical-to-virtual address mapping information (L2V mapping) stored in the memory device 150 and mapping information in the data region for storing user data. The recovery algorithm can be capable of recovering the logical-to-virtual address mapping information (L2V mapping). The virtual flash layer VFL may perform an address conversion process regarding the virtual address space, based on the logical-to-virtual address mapping information (L2V mapping) restored through such the recovery algorithm.

The flash interface layer FIL can convert a virtual page address of the virtual flash layer VFL into a physical page address of the memory device 150. The flash interface layer FIL performs a low-level operation for interfacing with the memory device 150. For example, the flash interface layer FIL can include a low-level driver for controlling hardware of the memory device 150, an error correction code (ECC) for checking and correcting an error in data transmitted from the memory device 150, and a module for performing operations such as Bad Block Management (BBM).

Figure 5:
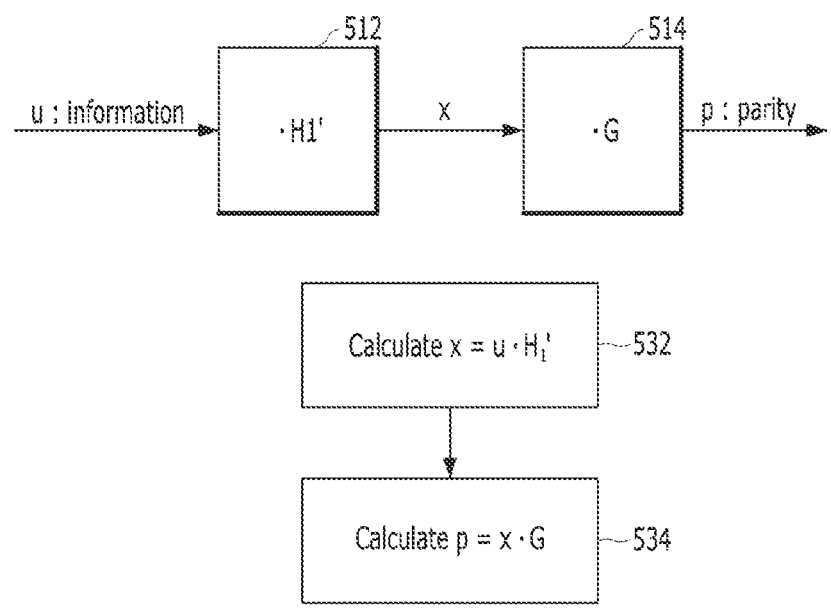
FIG. 5 illustrates an example of an encoding apparatus that generates a low-density parity check (LDPC) code.

FIG. 5 illustrates an example of an encoding apparatus that generates a low-density parity check (LDPC) code.

Referring to FIG. 5, the encoding apparatus can encode K-bit data (u) into an N-bit codeword (C) based on a low-density parity check (LDPC) code. In this case, it is assumed that the codeword (C) has N bits, the input data (u) has K bits, and the generated parity has M bits. This is shown in Equation 1 described below.

$$C = uGM \quad \text{(Equation 1)}$$

Herein, GM is a generator matrix of M×N size. A parity check matrix (H Matrix) is a binary matrix of K×N size. GM may satisfy Equation 2 below.

$$GMH^t = 0 \quad \text{(Equation 2)}$$

A column of the parity check matrix (H Matrix) can be associated with a bit of the codeword, and each row may correspond to a parity check. An '1' included in each row indicates that the corresponding bit contributes to the parity check. The LDPC code can be divided into a regular code and an irregular code according to characteristics of the parity check matrix (H Matrix). The LDPC code can be regular when all rows have the same number of '1' and all columns have the same number of '1'. Otherwise, the LDPC code can be irregular. Specifically, the LDPC code can be expressed as a Tanner graph, which is an equivalent bipartite graph. The Tanner graph is a graph in which a parity check matrix (H Matrix) is used as an incidence matrix. Each column of the parity check matrix (H Matrix) is a variable node, and each row is a check node. Each '1' of the parity check matrix (H Matrix) can indicate an edge connecting one variable node and one check node. The number of edges connected to a node is called a degree of that node. When all the variable nodes have the same degree and all check nodes have the same degree, the LDPC code is called a regular LDPC code. Otherwise, the LDPC code can be referred to as an irregular LDPC code.

The parity check matrix (H Matrix) can include two matrices: a first partial matrix $H_1$ corresponding to a parity bit and a second partial matrix $H_2$ corresponding to a data size, as shown in following Equation 3.

$$H=[H_1 H_2] \qquad \text{(Equation 3)}$$

That is, the parity check matrix (H Matrix) may include an (M×K) partial matrix $H_1$ and a (K×K) partial matrix $H_2$. Herein, the (M×K) partial matrix $H_1$ is a sparse matrix having a low density, but the (K×K) partial matrix $H_2$ might not be a sparse matrix. Based on some embodiments of the disclosed technology, the (K×K) partial matrix $H_2$ may have an (M−1) degree in two columns and a final degree in one column. Referring to the Equations 1 to 3, the generator matrix GM may be defined as in following Equation 4.

$$GM=[uH_1^t H_2^{-t}] \qquad \text{(Equation 4)}$$

The codeword (C) output from the encoding apparatus described in FIG. 5 is a sum of the input data (u) and the parity (p).

$$C=u+p \qquad \text{(Equation 5)}$$

In an encoding operation using the LDPC code, an encoding calculation regarding the input data (u) among the codeword (C) might be not performed in order to reduce an amount of computation and reduce the complexity, but an encoding calculation for determining the parity (p) would be performed. Accordingly, referring to Equations 1 and 4, an operation for each of the parity (p) can be defined as in following Equations 6 to 8.

$$[up]*[H_1 H_2]=uH_1^t+pH_2^t=0 \qquad \text{(Equation 6)}$$

$$uH_1^t=pH_2^t \qquad \text{(Equation 7)}$$

$$p=[uH_1^t H_2^{-t}] \qquad \text{(Equation 8)}$$

Referring to FIG. 5, the encoding apparatus can perform computation for determining the parity (p) based on the low density parity check code (LDPC code). Specifically, the encoding apparatus generates a first result (x) by multiplying the input data (u: information) by a first matrix (H1') (operation 532), and then multiplying the first result (x) by a second matrix (G) to determine parity (p: parity) (operation 534). The encoding apparatus can include a first calculator 512 configured to multiply the input data (u: information) by the first matrix H1' and a second calculator 514 configured to multiply the first result (x) by the second matrix (G). Accordingly, the second matrix G described in FIG. 5 may be $H_2^{-t}$.

The first matrix $H_1$ described in FIG. 5 is a sparse matrix having a low density, but the second matrix G can be denser than the first matrix $H_1$, so that a lot of resources used to perform matrix multiplication in the memory system 110 can be consumed. Based on some embodiments of the disclosed technology, the number of calculations in a matrix multiplication using the second matrix G may have a characteristic proportional to a square of a parity length.

Figure 6:
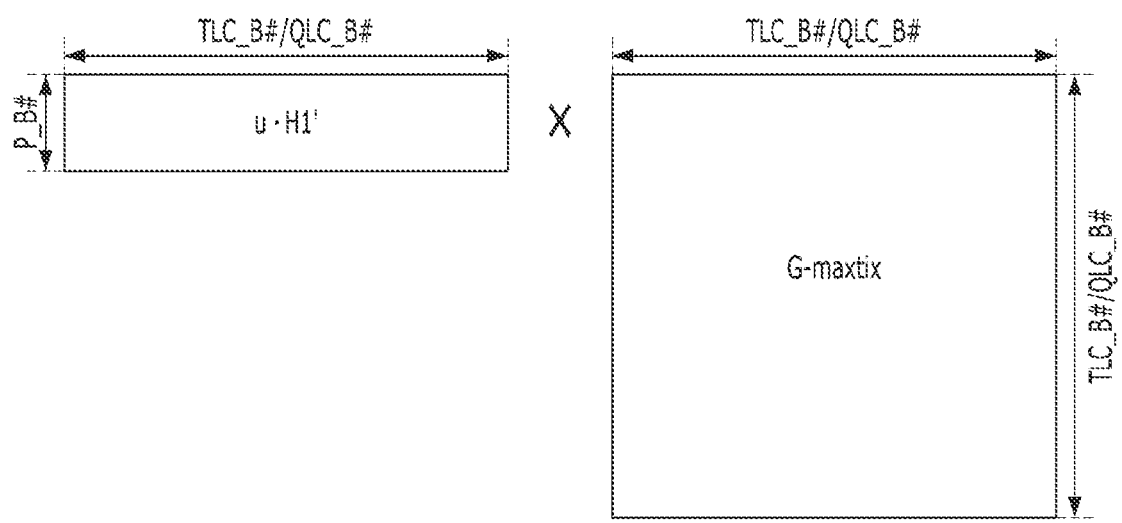
FIG. 6 illustrates an example of a first matrix and a second matrix used in FIG. 5.

FIG. 6 illustrates an example of a first matrix and a second matrix used in FIG. 5.

Referring to FIG. 6, the first matrix (H1') may have a (M×K) size. Herein, K is the number of bits of an input data (u), and M is the number of bits of a parity. The second matrix (G matrix) may have a (K×K) size. The codeword C, which is the sum of the data and the parity, may have a length of N bits. When non-volatile memory cells included in the memory device 150 are TLCs capable of storing 3-bit data, the second matrix (G matrix) may have a (TLC_B #×TLC_B #) size. When the non-volatile memory cells included in the memory device 150 are QLCs capable of storing 4-bit data, the second matrix (G matrix) may have a (QLC_B #×QLC_B #) size. When the non-volatile memory cells in the memory device 150 are TLC or QLC, the parity can set equally to have a length of 128 bits.

An encoding apparatus, using the LDPC code, included in the memory system 110 can include a first matrix (H1') and a second matrix (G matrix) which have different sizes according to a size of data transmitted by the controller 130 to the memory device 150. An example of data transmitted from the controller 130 to the memory device 150 is program data (data to be written to the memory device) transmitted during a program operation.

The memory system 110 may set various program operations. Basically, when a page is set as the smallest unit for the program operation, the controller 130 may transmit data having a size corresponding to a page size to the memory device 150. Also, depending on whether the memory device 150 includes a decoding apparatus corresponding to the encoding apparatus included in the controller 130, the size of data transmitted by the controller 130 to the memory device 150 may be changed.

For example, it is assumed that the number of non-volatile memory cells connected to a single word line in the memory device 150 is 200. 150 non-volatile memory cells among 200 non-volatile memory cells can be allocated as a data region for storing data, and 50 non-volatile memory cells can be left with a spare region. Based on some embodiments of the disclosed technology, the size of data that can be transferred for a single program operation can be determined according to the number of non-volatile memory cells allocated as the data region and the number of bits of data that can be stored in each non-volatile memory cell. The controller 130 may transmit an amount of data that can be transmitted for the program operation to the memory system 150 in a single data transmission.

In addition, when 3 bits, 4 bits or more bit data can be stored in a non-volatile memory cell, the controller 150 may transfer a data item stored in each memory cell on a bit basis. For example, the controller 130 can transmit a first data item corresponding to the most significant bit (MSB) of 150 non-volatile memory cells to the memory device 150, transmit a second data item corresponding to the most significant bit (MSB) of the 150 non-volatile memory cells to the memory device 150, and then transmit a third data item corresponding to the least significant bit (LSB) of the 150 non-volatile memory cells to the memory device 150, sequentially.

The codeword output from the encoding apparatus using a low-density parity check (LDPC) code can include the data (u) and the parity (p). Based on some embodiments of the disclosed technology, both the data (u) and the parity (p) can be stored in the data region of each page in the memory device 150, or the data (u) and the parity (p) can be individually stored in the data region and the spare region of each page in the memory device 150.

As above described, according to how the controller 130 performs a program operation and how the memory device 150 stores data and a parity, a length of the codeword output from the encoding apparatus using the LDPC code can be differently set. Further, according to a size of the data input to the encoding apparatus or the number of bits of the parity or the codeword output from the encoding apparatus, sizes of the first matrix (H1') and the second matrix (G matrix) used by the encoding apparatus may vary.

Figure 7:
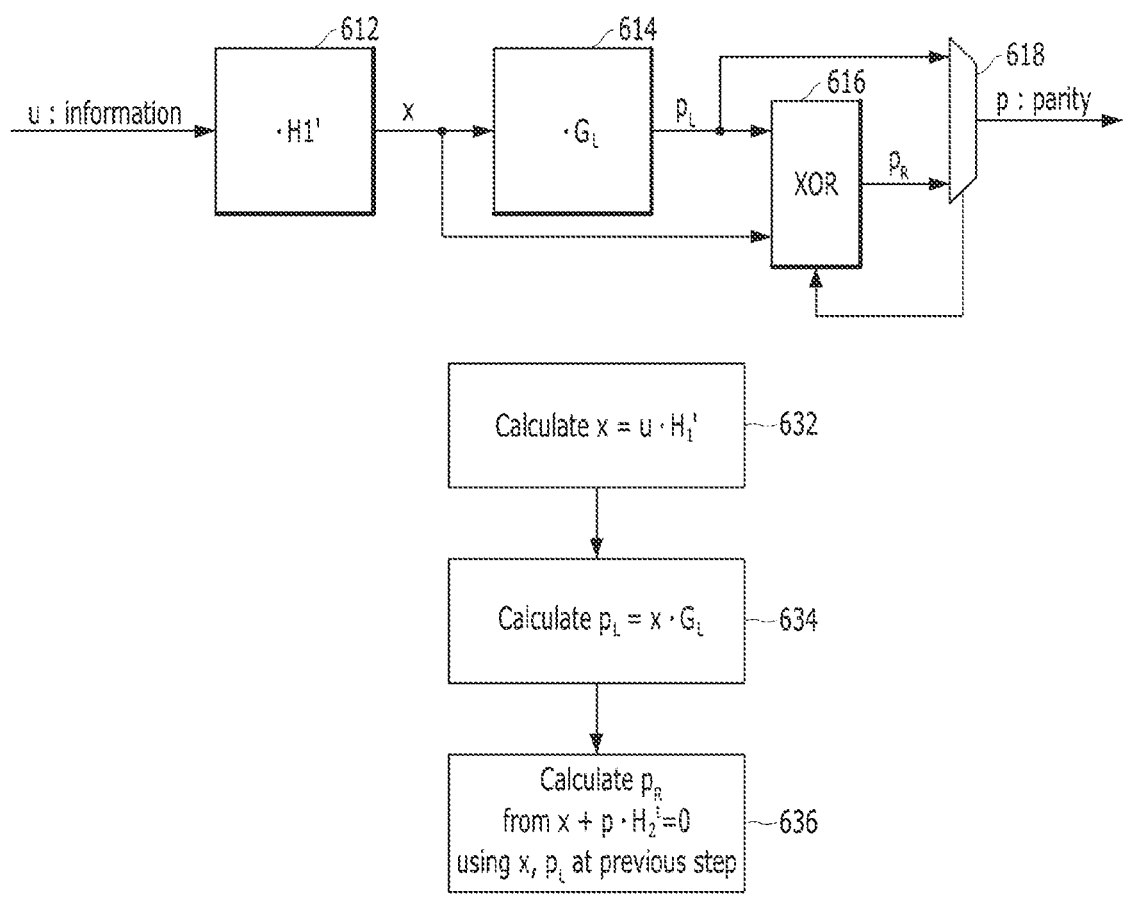
FIG. 7 illustrates an example of an encoding apparatus and method based on some embodiments of the disclosed technology.

FIG. 7 illustrates an example of an encoding apparatus and method based on some embodiments of the disclosed technology.

Referring to FIG. 7, an encoding operation for determining a parity associated with input data (u) may be performed in two different methods. One of the two methods is to perform matrix multiplication, and the other is to perform an exclusive OR (XOR) operation, which is a kind of logical operation. Specifically, in the encoding operation, a first result (x) can be obtained by multiplying the input data (u, information) by the first matrix (H1') (operation 632). The parity (p) can be divided into a first parity group $P_L$, obtained by multiplying the first result (x) by a second matrix ($G_L$), and a second parity group $P_R$, obtained by an exclusive OR operation of the first result (x) and the first parity group $P_L$, based on a plurality of polynomials generated multiplying the first result (x) by the second matrix ($G_L$). The encoding operation can include matrix multiplication performed on the first parity group $P_L$ (operation 634), and a logical operation on the second parity group $P_R$ using the first parity group $P_L$ (operation 636). An encoding apparatus in the controller 130 can determine the parity (p) for the input data (u) by performing computation for both the first parity group $P_L$ and the second parity group $P_R$, and then summing the data (u) and the parity (p) to generate the codeword (C). The codeword (C) may be output to the memory device 150.

The encoding apparatus in the controller 130 can perform a calculation on each bit of the parity (p) in an arbitrary order. In an embodiment, the encoding apparatus may change a calculation sequence to generate each bit of the parity (p), which corresponds to each of the plurality of polynomials, in order to reduce the number of parity bits included in the first parity group $P_L$. The change of the calculation sequence will be described in detail with reference to FIGS. 9 and 10 below.

In addition, the encoding apparatus in the controller 130 may use some parity bit which has been determined among the first parity group $P_L$ or the second parity group $P_R$ to perform an exclusive OR (XOR) operation in following operations according to the calculation sequence corresponding to the plurality of polynomials. An operation for determining each parity bit included in the first parity group $P_L$ or the second parity group $P_R$ will be described in detail with reference to FIGS. 9 and 10 below.

Specifically, the encoding apparatus in the controller 130 can include a first calculator 612 configured to multiply the input data (u) and the first matrix (H1') to output the first result (x), a first selector configured to divide the parity (p) into the first parity group $P_L$ and the second parity group $P_R$, a second calculator 614 configured to multiply the first result (x) by the second matrix ($G_L$) to determine a parity bit included in the first parity group $P_L$, a second selector configured to selectively transmits an output of the second calculator 614 for the exclusive OR (XOR) operation, determination circuitry 618 configured to sequentially group parity bits included in the first and second parity groups $P_L$, $P_R$, and feedback at least one parity for the exclusive OR (XOR) operation, and a third calculator 616 configured to perform the exclusive OR (XOR) operation of the first result (x) and parity bits outputted from the second selector and the determination circuitry 618 to obtain a parity included in the second parity group $P_R$.

Figure 8:
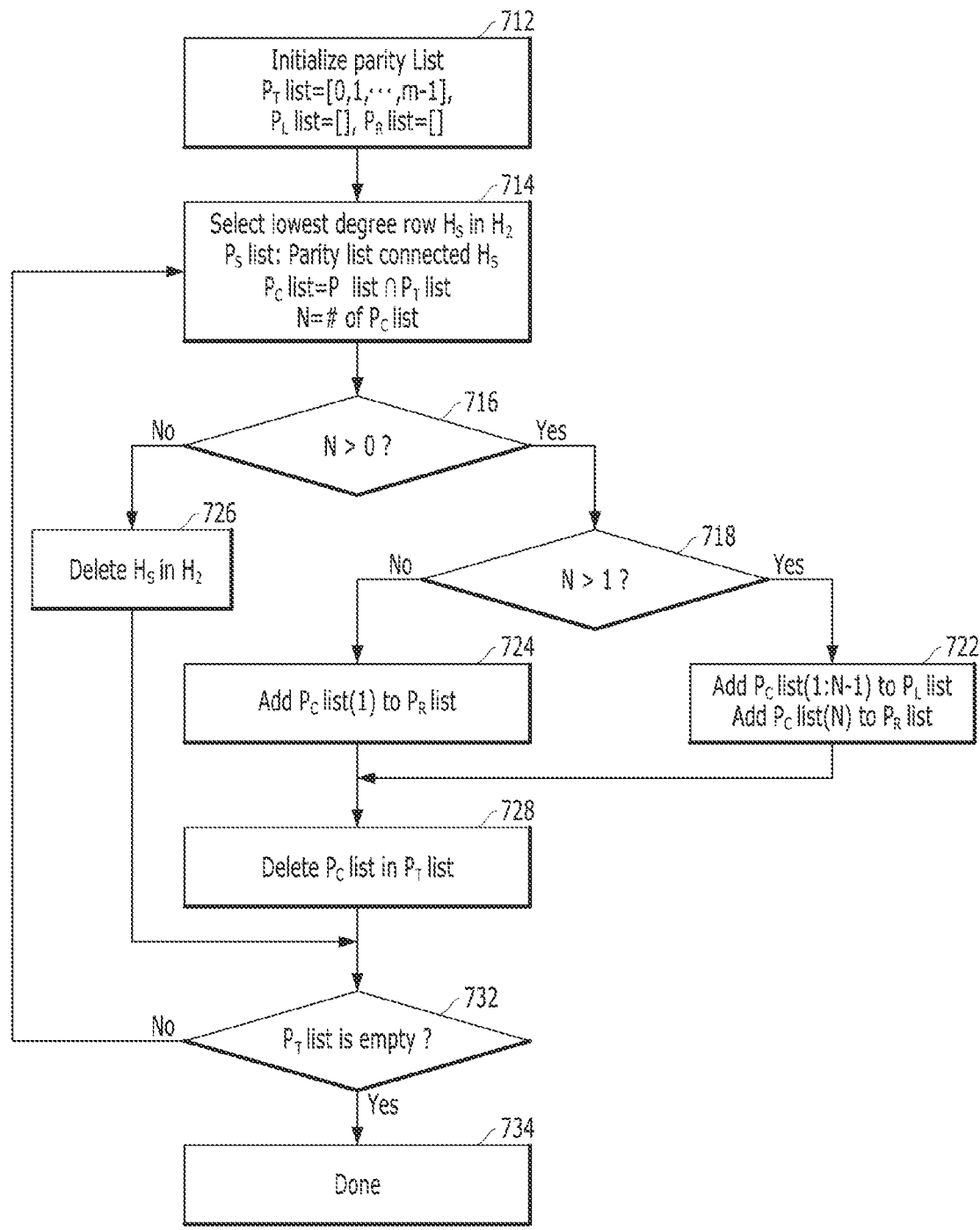
FIG. 8 illustrates a flow chart of an encoding method based on some embodiments of the disclosed technology.

FIG. 8 illustrates a flow chart of an encoding method based on some embodiments of the disclosed technology.

Referring to FIG. 8, the encoding method includes initializing a transmitted parity list ($P_T$ list), a first parity group list ($P_L$ list), and a second parity group list ($P_R$ list) transmitted from the controller 130 to the memory device 150 (operation 712). The transmitted parity list ($P_T$ list) may include M number of parity bits (0 to m−1, i.e., $P_0$ to $P_{m-1}$) which are determined by computation or calculations.

The controller 130 selects a row $H_s$ having the lowest degree from the second matrix $H_2$. The controller 130 generates a first parity list ($P_S$ list) associated with the row $H_s$. In addition, the controller 130 can add a parity bit which is duplicated in the first parity list ($P_S$ list) and the transmitted parity list ($P_T$ list) to a second parity list ($P_C$ list). The controller 130 may set the number of parity bits included in the second parity list ($P_C$ list) to 'N.' Herein, 'N' may denote the number of parity bits that are not already determined among parity bits used for an operation to determine another specific parity bit.

The controller 130 may check whether 'N' is greater than 0 (operation 716). If 'N' is 0 (No in operation 716), the controller 130 may delete a selected row $H_s$ from the second matrix $H_2$ (operation 726). The controller 130 may check whether the transmitted parity list ($P_T$ list) is empty (operation 732). If the transmitted parity list ($P_T$ list) is empty (Yes in operation 732), the controller 130 may finish the encoding operation (operation 734). If the transmitted parity list ($P_T$ list) is not empty (No in operation 732), the controller 130 may select another row $H_s$ having the lowest degree from the remaining second matrix $H_2$ (operation 714). In some embodiments of the disclosed technology, a plurality of rows $H_s$ of the second matrix $H_2$ may correspond to the plurality of polynomials described in FIGS. 9 and 10.

If 'N' is not 0 (Yes in operation 716), the controller 130 may check whether 'N' is greater than '1' (operation 718). If 'N' is greater than '1' (Yes in operation 718), the controller 130 should perform matrix multiplication. The controller 130 excludes one from the second parity list ($P_C$ list) and includes the remaining parity bits in the first parity group list ($P_L$ list), and the excluded parity bit can be included in the second parity group list ($P_R$ list) (operation 722). The controller 130 may not perform matrix multiplication on the N number of parity bits, and may perform the exclusive OR (XOR) operation one parity bit.

If 'N' is 1 (No in operation 718), the controller 130 does not need to perform matrix multiplication. The controller 130 may add a parity bit included in the second parity list ($P_C$ list) in the second parity group list ($P_R$ list).

As above described, after the controller 130 divides the parity bits into the first parity group list ($P_L$ list) and the second parity group list ($P_R$ list), the controller 130 can delete a parity of the second parity list ($P_C$ list) from the transmitted parity list ($P_T$ list) (728). Because parity bits are divided into the first parity group list ($P_L$ list) and the second parity group list ($P_R$ list), at least some corresponding parity bit can be deleted from the transmitted parity list ($P_T$ list) to reduce the number of calculation or an amount of computation for determining parity bits additionally (operation 728).

Thereafter, the controller 130 may check whether the transmitted parity list ($P_T$ list) is empty (operation 732). If the transmitted parity list ($P_T$ list) is empty (Yes in operation 732), the controller 130 may terminate the encoding operation (operation 734). If the transmitted parity list ($P_T$ list) is not empty (No in the operation 732), the controller 130 may select another row $H_s$ having the lowest degree from the remaining second matrix $H_2$ (operation 714).

Referring to FIGS. 7 and 8, in a process of calculating and determining the parity transmitted to the memory device 150 by the controller 130, the above-described encoding operation can provide an example of dividing parity bits into the first parity group $P_L$ in which a parity bit is obtained by multiplying the first result (x) by the second matrix ($G_L$) and the second parity group $P_R$ in which a parity bit is obtained by performing the exclusive OR (XOR) operation of the first result (x) and the first parity group $P_L$. In some embodiments of the disclosed technology, this operation may be performed by the first selector which can be capable of dividing parity bits into the first parity group $P_L$ and the second parity group $P_R$ in the encoding apparatus. In another embodiment, another device or module can perform an operation to classify the above-described parity bits into the first parity group $P_L$ and the second parity group $P_R$ in the controller 130, and then the encoding apparatus described in FIG. 7 can control an operation to sequentially calculate parity bits included in the first parity group $P_L$ and the second parity group $P_R$.

Figures 9, 10:
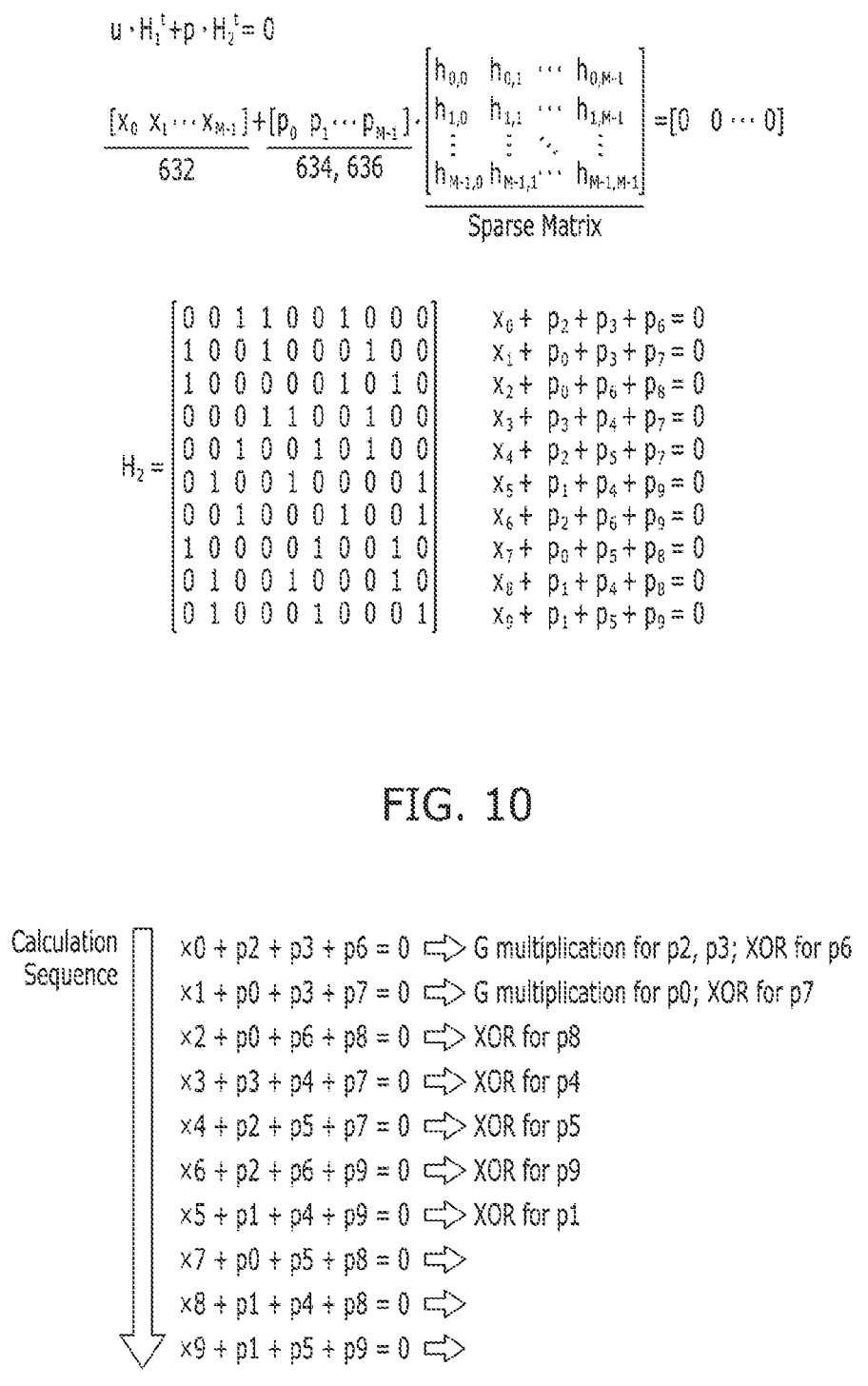

FIG. 9 illustrates calculations of a low density parity check (LDPC) code based on some embodiments of the disclosed technology. FIG. 9 show how to determine a parity through the encoding operation described in FIG. 7.

Referring to FIG. 9, it is assumed that an input data (u) has M bits (M=10), and the equation 6 is applicable to the input data (u). In addition, referring to FIGS. 7 and 9, the first result ($x_0, x_1, \ldots, x_{M-1}$) can be obtained through the operation 632 of multiplying the first matrix $H_1$ and the input data (u). 10 parity bits or parity bits ($p_0, p_1, \ldots, p_{M-1}$) can be obtained through matrix multiplication (operation 634) and the exclusive OR (XOR) operation (operation 636). An example of the second matrix $H_2$ is shown in FIG. 9.

First, when multiplication is performed on the second matrix $H_2$, ten polynomials for ten first results ($x_0, x_1, \ldots, x_{M-1}$) can be calculated. When a regular LDPC code is used, each of the 10 polynomials can include the same number of variables (e.g., 4 variables). When the first result ($x_0, x_1, \ldots, x_{M-1}$) is calculated and then 10 parity bits ($p_0, p_1, \ldots, p_{M-1}$) are determined through matrix multiplication, the amount of computation may increase. Herein, 10 polynomials can be sequentially calculated.

In a first polynomial, three parity bits ($p_2, p_3, p_6$) excluding the first result ($X_0$) have not yet been determined. The controller 130 may perform matrix multiplication using the second matrix $H_2$ for two of the three parity bits $p_2, p_3, p_6$, and may perform an exclusive OR (XOR) operation for the other one of the three parity bits $p_2, p_3, p_6$ (see operation 722 in FIG. 8).

When the operation on the first polynomial is ended, the controller 130 can perform an operation on the second polynomial. In the second polynomial, the first result ($X_1$) and one parity ($p_3$) were determined, but the two parity bits ($p_0, p_7$) have not yet been determined. The controller 130 may perform matrix multiplication using the second matrix $H_2$ for one of the two parity bits $p_0, p_7$, and may perform an exclusive OR (XOR) operation for the other of the two parity bits $p_0, p_7$ (see operation 722 of FIG. 8).

When the operation on the second polynomial is finished, the controller 130 can perform an operation on the third polynomial. In the third polynomial, the first result ($X_2$) and two parity bits ($p_0, p_6$) have been determined, but one parity $p_8$ has not yet been determined. The controller 130 may perform an exclusive OR operation for the one parity $p_8$, so that the controller 130 might not perform matrix multiplication using the second matrix $H_2$ for determining the one parity $p_8$ (see operation 724 in FIG. 8).

As described above, when calculations for a plurality of polynomials are sequentially performed, matrix multiplication using the second matrix $H_2$ is performed for only some of the 10 parity bits, and other parity bits can be determined through an exclusive OR (XOR) operation.

FIG. 10 illustrates matrix multiplications and logic operations that are performed to obtain the LDPC code described in FIG. 9.

When the 10 polynomials described in FIG. 9 are sequentially calculated, the controller 130 may perform matrix multiplication in many cases. After determining all the 10 parity bits, the controller 130 may sequentially arrange and transmit the 10 parity bits to the memory device 150. In some embodiments of the disclosed technology, in order to reduce a case of performing matrix multiplication (G multiplication) using the second matrix $H_2$, the controller 130 may adjust or change a calculation sequence for the 10 polynomials.

Referring to FIGS. 9 and 10, an order of calculation for two polynomials associated with two first results $x_5, x_6$ is changed. When the polynomial for the first result $x_5$ is calculated earlier than the polynomial for the first result $x_6$, matrix multiplication (G multiplication) should be performed to determine at least one of the two parity bits $p_1, p_9$. However, when the polynomial for the first result $x_6$ is calculated first after the calculation sequence is changed, the parity bits $p_1, p_9$ both can be sequentially determined through an exclusive OR (XOR) operation.

Referring to FIG. 10, all 10 parity bits may be determined through calculations on 7 polynomials out of 10 polynomials. In addition, matrix multiplication (G multiplication) is performed for only 3 parity bits $p_2, p_3, p_0$ out of 10 parity bits, and the remaining 7 parity bits $p_1, p_4, p_5, p_6, p_7, p_8, p_9$ can be determined by an exclusive OR (XOR) operation. Accordingly, the performance ratio (g_mult_ratio) of the matrix multiplication (G multiplication) may be ³⁄₁₀ (i.e., 0.3).

Referring to FIGS. 6 and 9 to 10, a first case of performing matrix multiplication for all parity bits can be compared with a second case of reducing matrix multiplication and replacing matrix multiplication with an exclusive OR operation. First, it is assumed that an average density of the second matrix $H_2$ is 0.5.

In a case of performing matrix multiplication for all parity bits, when a data length is M bits, the number of calculations can be determined as follows.

$$\#\text{of Calculations} = M \times M \times 0.5(\text{average density}) \quad \text{(Equation 9)}$$

Referring to FIG. 6, assuming that M is 30 corresponding to non-volatile memory cells in the memory device 150, the number of calculations is 450 (=30×30×0.5).

On the other hand, in a case of reducing matrix multiplication and replacing matrix multiplication with an exclusive OR operation, the number of calculations can be determined as follows when the data length is M bits.

$$\#\text{of Calculations} = M \times (M \times g\_\text{mult\_ratio}) \times 0.5 + M \times (1 - g\_\text{mult\_ratio}) \times V\_\text{deg} \quad \text{(Equation 10)}$$

Herein, 'V_deg' denotes the degree of a variable node of the parity check matrix (H Matrix). Referring to FIG. 6, assuming that M is 30, corresponding to non-volatile memory cells in the memory device 150, the number of calculations is 250 (=30×30×(⅓)×0.5+30×(1−⅓)×5). In some embodiments of the disclosed technology, when some matrix multiplication is replaced by an XOR operation, the amount of computation or the number of calculations can be reduced by 50 to 70%.

In FIGS. 9 and 10, a regular low-density parity check code (regular LDPC code) is illustrated by way of example, but an irregular low-density parity check code (irregular LDPC code) is also applicable. In the case of the regular low-density parity check code (regular LDPC code), the number of the variables may be the same in a plurality of polynomials. For example, in FIG. 10, there are four variables in each polynomial. On the other hand, in the case of the irregular low density parity check code (irregular LDPC code), the number of variables included in each polynomial may vary. In this case, in order to reduce the number of matrix multiplication operations (G multiplication) while increasing the number of exclusive OR (XOR) operations, the controller 130 can first perform a calculation on polynomials with a small number of variables, and operations for polynomials with a great number of variables are delayed, and as a result a calculation sequence can be modified.

FIG. 11 illustrates an effect of an encoding apparatus in a memory system based on some embodiments of the disclosed technology. FIG. 11 shows a computation amount of the encoding apparatus, which can be determined based on the number of bits of data stored in non-volatile memory cells TLC, QLC in the memory device 150 through the Equations 9 and 10. Herein, a gate count can correspond to the computation amount of the encoding apparatus.

For configuring the encoding apparatus, when matrix multiplication is performed on all parity bits at a data length (2 KB, 4 KB) (conventional examples), a gate count of a is required in a case of a TLC and 2 KB data length, and a gate count of 1.22-1.39a is required om a case of TLC, QLC and a 4 KB data length. On the other hand, in a case of reducing matrix multiplication and replacing matrix multiplication with an exclusive OR operation (Embodiment), a gate count of 0.85 to 0.92a is required in a case of TLC, QLC and a 4 KB data length. In some embodiments of the disclosed technology, compared with two cases of TLC and a 4 KB data length, an amount of G-matrix multiplication operation may be reduced by about 60 to 70% based on the use of a regular LDPC code. Thus, the gate counts of the encoding apparatus can be reduced by about 30-35%. Accordingly, resource utilization of the memory system 110 may be improved.

A memory system based on some embodiments of the disclosed technology may improve performance of detecting and correcting errors occurring in the memory system by using a Low Density Parity Check (LDPC) code.

In addition, the memory system based on some embodiments of the disclosed technology has an advantage of reducing resource consumption in the memory system by reducing an amount of computation for using the low density parity check code (LDPC code) to generate parity bits.

Although various embodiments have been described for illustrative purposes, variations or enhancements to the disclosed embodiments and other embodiments can be made based on what is disclosed in this patent document.

What is claimed is:

1. An error correction code apparatus, comprising:
a data input node configured to receive data to be encoded; and
an encoder in communication with the data input node and configured to:
generate a first result by multiplying bits of the data by a first matrix;
divide parity bits into a first parity group and a second parity group based on a plurality of polynomials determined by a second matrix;
multiply the first result and the second matrix to generate one or more first parity bits in the first parity group;
perform an exclusive OR operation on the first result and the one or more first parity bits included in the first parity group to generate one or more second parity bits in the second parity group; and
generate a codeword having the bits of the data bits and the first and second parity bits.

2. The error correction code apparatus according to claim 1, wherein the encoder is configured to change a calculation sequence for generating the one or more first parity bits and the one more second parity bits to reduce a number of first parity bits included in the first parity group.

3. The error correction code apparatus according to claim 1, wherein the encoder is configured to use one or more first or second parity bits that have been calculated in the first parity group or the second parity group to perform a subsequent exclusive OR operation, based on a calculation sequence, for generating another second parity bit.

4. The error correction code apparatus according to claim 1, wherein the encoder comprises:
a first calculator configured to multiply the bits of the data by the first matrix to output the first result;
a first selector configured to divide the parity bits into the first parity group and the second parity group;
a second calculator configured to multiply the first result by the second matrix to determine the one or more first parity bits included in the first parity group;
a second selector configured to selectively transfer an output of the second calculator for the exclusive OR operation;
determination circuitry configured to sequentially group the number of parity bits and feedback at least one parity bit for the exclusive OR operation; and
a third calculator configured to perform the exclusive OR operation on the first result and the first and second parity bits outputted from the second selector and the determination circuitry to obtain the one or more second parity bits included in the second parity group.

5. The error correction code apparatus according to claim 1, wherein the first matrix includes: a number of rows that represents the number of the bits of data; and a number of columns that represents the number of parity bits, and the second matrix includes: a number of rows that represents the first number of parity bits; and a number of columns that represents the first number of parity bits.

6. The error correction code apparatus according to claim 1, wherein each of the plurality of polynomials determined by multiplication of the first result and the second matrix comprises a mathematical relationship between the first result and at least part of the parity bits.

7. A memory system, comprising:
a memory device comprising a plurality of non-volatile memory cells; and
a controller in communication with the memory device and configured to store a codeword in the plurality of non-volatile memory cells or read the codeword from the plurality of non-volatile memory cells, and
wherein the controller is configured to:
multiply one or more data bits by a first matrix to generate a first result;
obtain a first parity group of parity bits by multiplying the first result by a second matrix and a second parity group of parity bits by an exclusive OR operation on the first result and the first parity group of parity bits, based on a plurality of polynomials determined based on the second matrix; and combine the one or more data bits and the first and second parity groups of parity bits to generate the codeword.

8. The memory system according to claim 7, wherein a length of the codeword is determined based on a length of the one or more bits programmed or read at each program operation or read operation.

9. The memory system according to claim 7, wherein the controller is configured to change a calculation sequence for generating the one or more first parity bits in the first parity group and the one more second parity bits in the second parity group to reduce a number of first parity bits included in the first parity group.

10. The memory system according to claim 7, wherein the controller is configured to use one or more first or second parity bits that have been calculated in the first parity group or the second parity group to perform a subsequent exclusive OR operation, based on a calculation sequence, for generating another second parity bit.

11. The memory system according to claim 7, wherein the controller comprises:
a first calculator configured to multiply the one or more data bits by the first matrix to output the first result;
a first selector configured to divide the parity bits into the first parity group and the second parity group;
a second calculator configured to multiply the first result by the second matrix to determine the one or more first parity bits included in the first parity group;
a second selector configured to selectively transfer an output of the second calculator for the exclusive OR operation;
determination circuitry configured to sequentially group the first and second parity bits included in the first and second parity groups and feedback at least one parity bit for the exclusive OR operation; and
a third calculator configured to perform the exclusive OR operation on the first result and the first and second parity bits outputted from the second selector and the determination circuitry to obtain the one or more second parity bits included in the second parity group.

12. The memory system according to claim 7, wherein the one or more data bits include a first number of data bits and the parity bits include a second number of parity bits, and wherein the first matrix includes: a number of columns that represents the number of parity bits; and a number of rows that represents the first number of data bits, and the second matrix includes: a number of rows that represents the second number of parity bits; and a number of columns that represents the second number of parity bits.

13. The memory system according to claim 7, wherein each of the plurality of polynomials determined by multiplication of the first result and the second matrix comprises a mathematical relationship between the first result and at least part of the parity bits.

14. The memory system according to claim 7, wherein the controller is configured to detect and correct an error in the codeword upon receipt of the codeword from the memory device.

15. A method for operating a memory system, comprising:
checking one or more data bits and a program command input from an external device;
multiplying the one or more data bits by a first matrix to generate a first result;
dividing parity bits into a first parity group of parity bits obtained by multiplying the first result by a second matrix and a second parity group of parity bits obtained by an exclusive OR operation on the first result and the first parity group of parity bits, based on a plurality of polynomials determined by the second matrix;
combining the one or more data bits and the first and second parity groups of parity bits to generate a codeword; and
writing the generated codeword into the memory system.

16. The method according to claim 15, wherein a length of the codeword is determined based on a length of the one or more bits programmed or read once at each program operation or read operation.

17. The method according to claim 15, further comprising:
changing a calculation sequence for generating the one or more first parity bits in the first parity group and the one more second parity bits in the second parity group to reduce a number of first parity bits included in the first parity group.

18. The method according to claim 15, wherein the one or more first or second parity bits that have been calculated in the first parity group or the second parity group are used to perform a subsequent exclusive OR operation for generating another second parity bit according to a calculation sequence of the plurality of polynomials.

19. The method according to claim 15, wherein the one or more data bits include a first number of data bits and the parity bits include a second number of parity bits, and wherein the first matrix includes: a number of columns that represents the number of parity bits; and a number of rows that represents the first number of data bits, and the second matrix includes: a number of rows that represents the second number of parity bits; and a number of columns that represents the second number of parity bits.

20. The method according to claim 15, wherein each of the plurality of polynomials determined by multiplication of the first result and the second matrix comprises a mathematical relationship between the first result and at least part of the parity bits.

* * * * *